United States Patent
Kaneko et al.

(10) Patent No.: US 12,020,928 B2
(45) Date of Patent: Jun. 25, 2024

(54) SiC SEMICONDUCTOR SUBSTRATE, METHOD FOR MANUFACTURING SAME, AND DEVICE FOR MANUFACTURING SAME

(71) Applicants: KWANSEI GAKUIN EDUCATIONAL FOUNDATION, Hyogo (JP); TOYOTA TSUSHO CORPORATION, Nagoya (JP)

(72) Inventors: Tadaaki Kaneko, Hyogo (JP); Koji Ashida, Hyogo (JP); Tomoya Ihara, Hyogo (JP); Daichi Dojima, Hyogo (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 626 days.

(21) Appl. No.: 17/291,574

(22) PCT Filed: Nov. 5, 2019

(86) PCT No.: PCT/JP2019/043203
§ 371 (c)(1),
(2) Date: May 5, 2021

(87) PCT Pub. No.: WO2020/095872
PCT Pub. Date: May 14, 2020

(65) Prior Publication Data
US 2021/0398807 A1 Dec. 23, 2021

(30) Foreign Application Priority Data
Nov. 5, 2018 (JP) ................ 2018-208475

(51) Int. Cl.
*C30B 29/36* (2006.01)
*C30B 23/02* (2006.01)
(Continued)

(52) U.S. Cl.
CPC ........ *H01L 21/02529* (2013.01); *C30B 23/02* (2013.01); *C30B 25/20* (2013.01); *C30B 29/36* (2013.01); *H01L 21/02428* (2013.01); *H01L 21/02612* (2013.01)

(58) Field of Classification Search
CPC ......... C30B 23/02; C30B 25/20; C30B 29/36; H01L 21/02529; H01L 21/02428; H01L 21/02612
See application file for complete search history.

(56) References Cited

U.S. PATENT DOCUMENTS 10,626,520 B2 * 4/2020 Aigo .................. C30B 25/165
2004/0237879 A1 12/2004 Kaneko et al.

FOREIGN PATENT DOCUMENTS

JP 2004193631 A 7/2004
JP 2007506289 A 3/2007
(Continued)

OTHER PUBLICATIONS

English Translation of International Search Report from PCT/JP2019/043203 dated Feb. 10, 2020 (3 pages).

*Primary Examiner* — Robert M Kunemund
(74) *Attorney, Agent, or Firm* — Calfee, Halter & Griswold LLP

(57) ABSTRACT

An object of the present invention is to provide a SiC semiconductor substrate capable of reducing a density of basal plane dislocations (BPD) in a growth layer, a manufacturing method thereof, and a manufacturing device thereof. The method includes: a strained layer removal process S10 that removes a strained layer introduced on a surface of a SiC substrate; and an epitaxial growth process
(Continued)

S20 that conducts growth under a condition that a terrace width W of the SiC substrate is increased. When a SiC semiconductor substrate is manufactured in such processes, the basal plane dislocations BPD in the growth layer can be reduced, and a yield of a SiC semiconductor device can be improved.

30 Claims, 9 Drawing Sheets

(51) Int. Cl.
    *C30B 25/20*     (2006.01)
    *H01L 21/02*     (2006.01)

(56) References Cited

FOREIGN PATENT DOCUMENTS

| | | |
|---|---|---|
| JP | 2008108824 A | 5/2008 |
| JP | 2008205296 A | 9/2008 |
| JP | 2011219298 A | 11/2011 |
| JP | 2017059670 5 | 3/2017 |
| JP | 2017071525 A | 4/2017 |
| JP | 2018113303 A | 7/2018 |
| WO | 2014125550 8 | 8/2014 |
| WO | 2014199615 6 | 12/2014 |
| WO | 2017018533 A | 2/2017 |
| WO | 2017188381 | 11/2017 |
| WO | 2018174105 9 | 9/2018 |

\* cited by examiner (a)

(b)

(a)

(b)

(a)

(b)

(a)

(b)

SiC SEMICONDUCTOR SUBSTRATE, METHOD FOR MANUFACTURING SAME, AND DEVICE FOR MANUFACTURING SAME

CROSS-REFERENCE TO RELATED APPLICATIONS

This application is a 371 of PCT Application No. PCT/JP2019/043203 filed on Nov. 5, 2019, which claims priority to Japanese Application No. 2018-208475, filed on Nov. 5, 2018, the contents of which are hereby incorporated by reference as if recited in their entirety.

TECHNICAL FIELD

The present invention relates to a SiC semiconductor substrate, a manufacturing method thereof, and a manufacturing device thereof.

BACKGROUND ART

An epitaxial wafer in which SiC is epitaxially grown on a SiC (silicon carbide) substrate has many crystal defects and dislocations, which adversely affect the characteristics of the SiC semiconductor device.

In particular, basal plane dislocations (BPD) in an epitaxially grown layer (hereinafter referred to as an epi layer) expand to stacking defects when the SiC semiconductor device is bipolar-operated. Since these stacking defects cause the on-voltage of the SiC semiconductor device to increase and lead to the occurrence of bipolar deterioration, a technique for reducing the BPDs in the epi layer is strongly required.

The BPDs usually exist at densities of hundreds to thousands/$cm^2$ in SiC substrates. Many of these BPDs are known to be converted to threading edge dislocations (TED) during epitaxial growth. However, there is a problem that some of BPDs are taken over to the epi layer (for example, at a density of 0.1 to a few/$cm^2$).

Various techniques for improving a conversion rate to TEDs have been proposed for such problems. For example, in Patent Literature 1 and Patent Literature 2, a technique is described in which the density of BPDs in the epi layer is reduced when pits corresponding to dislocations included in the SiC substrate are formed, and then epitaxial growth is conducted on the surface on which the pits are formed.

However, Non Patent Literature 1 points out the problem that when epitaxial growth is conducted on the surface on which pits are formed, the shape of the pits is taken over during epitaxial growth, and the surface of the epi layer becomes rough.

Further, in Non Patent Literature 2, in the pn junction diode built in such an epi layer, the reliability of the on-state characteristic is reliably improved by the decrease of the BPD density, but the off-state characteristic deteriorates conversely.

CITATION LIST

Patent Literature

Patent Literature 1: JP 2007-506289 W
Patent Literature 2: JP 2017-71525 A

Non Patent Literature

Non Patent Literature 1: Appl. Phys. Lett. 2006, 89 (8), No. 081910.
Non Patent Literature 2: Mater. Sci. Forum. 527-529, (2006) pp. 1329-1334

SUMMARY OF INVENTION

Technical Problem

An object of the present invention is to provide a manufacturing method of a SiC semiconductor substrate capable of reducing a BPD density in an epi layer and a manufacturing device thereof.

Further, another object of the present invention is to provide a SiC semiconductor substrate having a growth layer having a BPD conversion rate of more than 99.95%, a manufacturing method thereof, and a manufacturing device thereof.

Solution to Problem

In order to solve the above problems, the manufacturing method of SiC semiconductor substrates according to one aspect of the present invention includes a strained layer removal process that removes a strained layer introduced on a surface of a SiC substrate; and an epitaxial growth process that conducts growth under a condition that a terrace width of the SiC substrate increases.

As described above, the epitaxial growth process of epitaxially growing the SiC substrate from which the strained layer is removed under the condition that the terrace width increases is included so that a BPD density in the growth layer can be reduced.

In the aspect, in the epitaxial growth process, growth is conducted in a SiC—C equilibrium vapor pressure environment.

As described above, the epitaxial growth process of growing the SiC substrate in the SiC—C equilibrium vapor pressure environment is included so that the BPD density in the growth layer can be reduced.

In the aspect, in the epitaxial growth process, a supplying source for Si atom and a supplying source for C atom are arranged for growth such that an atomic number ratio Si/C in a supplying space for source material is 1 or less.

As described above, the supplying source for Si atom and the supplying source for C atom are arranged so that a SiC—C equilibrium vapor pressure environment can be formed in the supplying space for source material.

In the aspect, in the epitaxial growth process, the SiC substrate is grown in a C-rich environment by using a CVD method.

As described above, the epitaxial growth process of growing the SiC substrate in the C-rich environment by using the CVD method is included so that the BPD density in the growth layer can be reduced.

In the aspect, in the epitaxial growth process, growth is conducted on the SiC substrate on which macro step bunching is not formed.

As described above, the epitaxial growth process of conducting growth on the surface on which the macro step bunching is not formed is included so that the BPD conversion rate in the growth layer can be made more than 99.95%.

In the aspect, in the epitaxial growth process, epitaxial growth is conducted under a growth condition that macro step bunching having a zigzag-shaped step end is formed when growth is conducted on a SiC substrate of which an off direction is <11–20>.

In the aspect, the epitaxial growth process is performed at a temperature of 1600° C. or higher.

When epitaxial growth is conducted in such a temperature range, a growth layer can be formed with high quality and high speed.

In the aspect, the manufacturing method further includes: a bunching decomposition process of decomposing the macro step bunching after the epitaxial growth process.

As described above, the bunching decomposition process of decomposing the MSB on the growth layer is included so that a preferable surface can be provided for the SiC semiconductor device.

The present invention also relates to a SiC semiconductor substrate. That is, the SiC semiconductor substrate of one aspect of the present invention includes: a bulk layer having basal plane dislocations; and a growth layer in which the basal plane dislocations are converted into other than basal plane dislocations. A conversion rate of the basal plane dislocations in the growth layer is more than 99.95%.

As described above, when the conversion rate of the basal plane dislocations in the growth layer is more than 99.95%, the occurrence of stacking defects due to BPD can be suppressed.

In the aspect, a surface of the bulk layer is arranged with steps having a height of one unit cell.

As described above, the steps having a height of one unit cell are arranged on the surface of the bulk layer so that the conversion rate of the basal plane dislocations in the growth layer becomes more than 99.95%. That is, it is possible to suppress the occurrence of stacking defects caused due to BPD.

The present invention also relates to a manufacturing device of the above-described SiC semiconductor substrate. That is, A manufacturing device of SiC semiconductor substrates according to one aspect of the present invention includes: a supplying space for source material for supplying Si atoms and C atoms to a SiC substrate for growth; and a high-temperature vacuum furnace capable of heating the supplying space for source material. The supplying space for source material has a supplying source for Si atom and a supplying source for C atom, and the supplying source for Si atom and the supplying source for C atom are arranged such that an atomic number ratio Si/C in the supplying space for source material is 1 or less.

With such a configuration, the SiC—C equilibrium vapor pressure environment can be formed in the supplying space for source material to grow the SiC substrate. As a result, the BPD in the growth layer can be reduced.

In the aspect, the manufacturing device further includes: a Si vapor pressure space in which a Si vapor pressure environment is formed. The supplying space for source material is evacuated through the Si vapor pressure space.

In this way, the supplying space for source material is evacuated (vacuumed) through the Si vapor pressure space, so that the SiC—C equilibrium vapor pressure environment in the supplying space for source material can be maintained for a long time.

In the aspect, the manufacturing device further includes: a source material container which has the supplying space for source material; and a carburizing container which has the Si vapor pressure space.

In the aspect, a temperature gradient is provided in the supplying space for source material such that a temperature decreases toward the SiC substrate.

Such a temperature gradient is provided so that the source material can be efficiently transported to the SiC substrate.

In the aspect, the high-temperature vacuum furnace includes a main heating chamber capable of heating the supplying space for source material, a preheating chamber which is connected to the main heating chamber, and a moving unit that moves the supplying space for source material. The moving unit is configured to be movable between the main heating chamber and the preheating chamber.

As described above, the supplying space for source material is configured to be movable from the main heating chamber to the preheating chamber, so that the temperature of the SiC substrate can be raised and lowered rapidly.

The present invention also relates to a method for reducing basal plane dislocations of SiC semiconductor substrates. That is, the method of reducing basal plane dislocations of SiC semiconductor substrates according to one aspect of the present invention is a manufacturing method of SiC semiconductor substrates including an epitaxial growth process that grows single crystal SiC on a SiC substrate. The method is a method which includes the epitaxial growth process of conducting growth under a condition that a terrace width of the SiC substrate increases and reduces basal plane dislocations of a SiC semiconductor substrate.

The method of reducing basal plane dislocations of SiC semiconductor substrates according to one aspect of the present invention is a manufacturing method of SiC semiconductor substrates including an epitaxial growth process that grows single crystal SiC on a SiC substrate. The method is a method in which the basal plane dislocations of the SiC semiconductor substrate are reduced by epitaxially growing the SiC substrate in the SiC—C equilibrium vapor pressure environment.

In the aspect, in the epitaxial growth process, epitaxial growth is conducted on the SiC substrate having a terrace width of less than 40 nm.

In the aspect, in the epitaxial growth process, a supplying source for Si atom and a supplying source for C atom are arranged for growth such that an atomic number ratio Si/C in a supplying space for source material is 1 or less.

In the aspect, in the epitaxial growth process, growth is conducted on the SiC substrate on which macro step bunching is not formed.

The present invention also relates to a manufacturing method of SiC semiconductor substrates. That is, the manufacturing method of SiC semiconductor substrates according to one aspect of the present invention includes: an epitaxial growth process that grows a SiC substrate in a SiC—C equilibrium vapor pressure environment.

In the aspect, in the epitaxial growth process, epitaxial growth is conducted on the SiC substrate having a terrace width of less than 40 nm.

In the aspect, in the epitaxial growth process, a supplying source for Si atom and a supplying source for C atom are arranged for growth such that an atomic number ratio Si/C in a supplying space for source material is 1 or less.

In the aspect, in the epitaxial growth process, growth is conducted on the SiC substrate on which macro step bunching is not formed.

A SiC semiconductor substrate according to one aspect of the present invention includes: a bulk layer which has basal plane dislocations; and a growth layer in which the basal plane dislocations are converted into other than the basal plane dislocations. A density of the basal plane dislocations of a surface of the bulk layer is 2000 pieces/cm$^2$ or more, and a density of the basal plane dislocations of a surface of the growth layer is 100 pieces/cm$^2$ or less.

A SiC semiconductor substrate according to one aspect of the present invention includes: a bulk layer which has basal plane dislocations; and a growth layer in which the basal plane dislocations are converted into other than the basal plane dislocations. A density of the basal plane dislocations of a surface of the bulk layer is 2000 pieces/cm² or more, and a density of the basal plane dislocations of a surface of the growth layer is less than 1 piece/cm².

A SiC semiconductor substrate according to one aspect of the present invention includes: a bulk layer which has basal plane dislocations; and a growth layer in which the basal plane dislocations are converted into other than the basal plane dislocations. A density of the basal plane dislocations of a surface of the bulk layer is 2000 pieces/cm² or more, and a density of the basal plane dislocations of a surface of the growth layer is 0 pieces/cm².

Advantageous Effects of Invention

According to the disclosed technique, it is possible to provide the manufacturing method of the SiC semiconductor substrate capable of reducing the density of basal plane dislocations (BPD) in the growth layer and a device thereof.

Further, the present invention can provide the SiC semiconductor substrate having a growth layer having a BPD conversion rate of more than 99.95%, the manufacturing method thereof, and the manufacturing device thereof.

Other issues, features and advantages will become apparent by reading the embodiments described below for carrying out the invention as taken up with drawings and claims.

DESCRIPTION OF EMBODIMENTS

Figure 1:
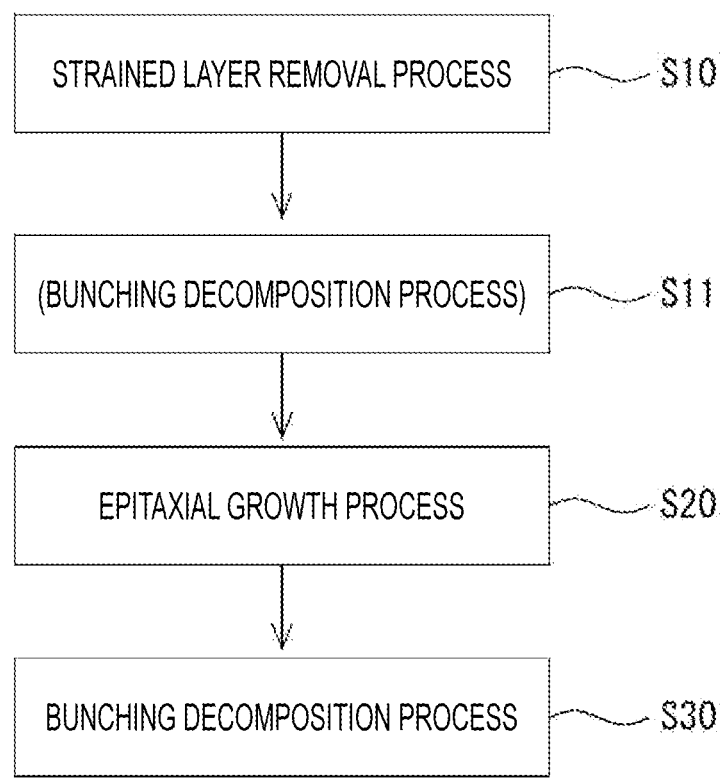
FIG. 1 is a schematic diagram illustrating a manufacturing process of SiC semiconductor substrates according to one embodiment.

Hereinafter, a preferred embodiment of the present invention illustrated in the drawings will be described in detail with reference to FIGS. 1 to 11. The technical scope of the present invention is not limited to the embodiments shown in the accompanying drawings, and can be appropriately changed within the scope described in the claims.

[Manufacturing Method of SiC Semiconductor Substrates]

Hereinafter, a manufacturing method of SiC semiconductor substrates according to one embodiment of the present invention will be described in detail.

As illustrated in FIG. 1, the manufacturing method of SiC semiconductor substrates according to one embodiment of the present invention includes a strained layer removal process (step S10) of removing a strained layer 11 introduced on a surface of a SiC substrate 10, an epitaxial growth process (step S20) of conducting growth under the condition that a terrace width W of the SiC substrate 10 increases, and a bunching decomposition process (step S30) of decomposing macro step bunching (MSB) formed in the epitaxial growth process S20.

In this way, when the SiC substrate 10 from which the strained layer 11 is removed is grown under the condition that the terrace width W increases, the conversion rate (BPD conversion rate) at which BPDs are converted into other defects/dislocations is improved, and a BPD density in a growth layer 13 can be reduced. The condition that the terrace width W increases is the condition that a terrace width W2 after growth increases as compared with a terrace width W1 before growth. For example, the condition can be realized by conducting growth in a SiC—C equilibrium vapor pressure environment or a C-rich environment.

Incidentally, in the strained layer removal process S10, it is desirable to use a method of removing the strained layer 11 and decomposing the MSB on the surface of the SiC substrate 10. Further, after the strained layer removal process S10 of removing the strained layer 11, additionally, a bunching decomposition process S11 of decomposing the MSB may be further included (see FIG. 1).

<SiC Substrate>

As the SiC substrate 10, any polytype can be used. As the substrate of the SiC semiconductor device, the SiC substrate 10 is used which is processed from the bulk crystal produced by a sublimation method or the like.

Figure 2:
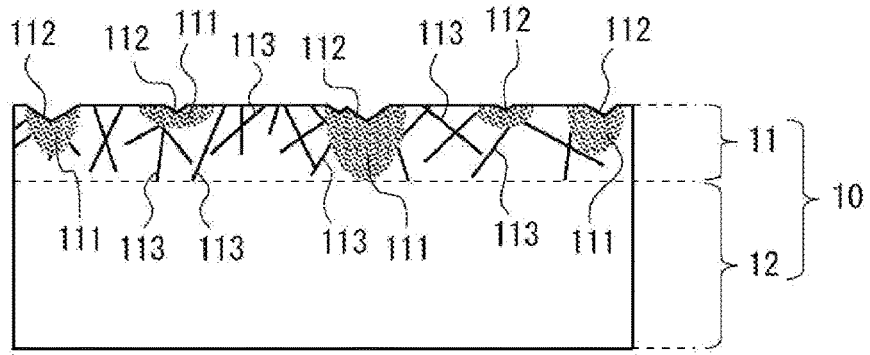
FIG. 2 is an explanatory diagram illustrating a strained layer removal process to a bunching decomposition process in the manufacturing process of SiC semiconductor substrates according to one embodiment.
Figure 2:
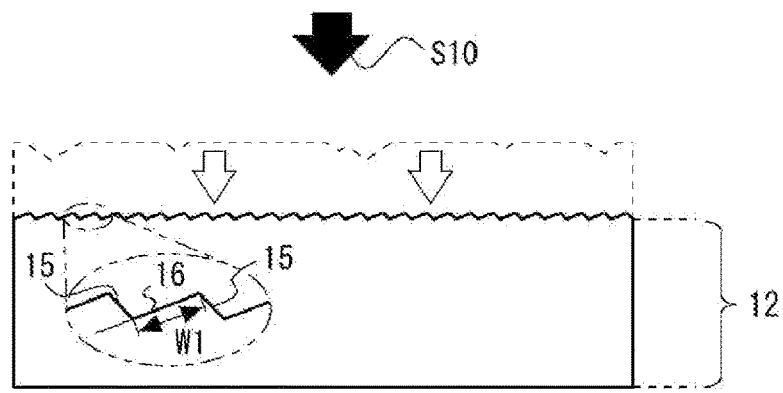
Figure 2:
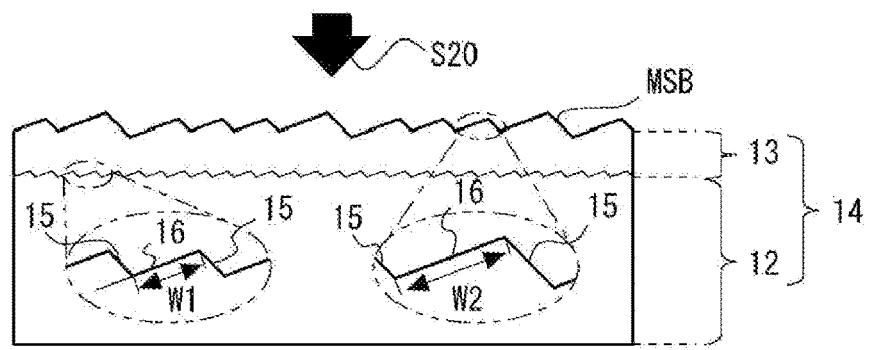
Figure 2:
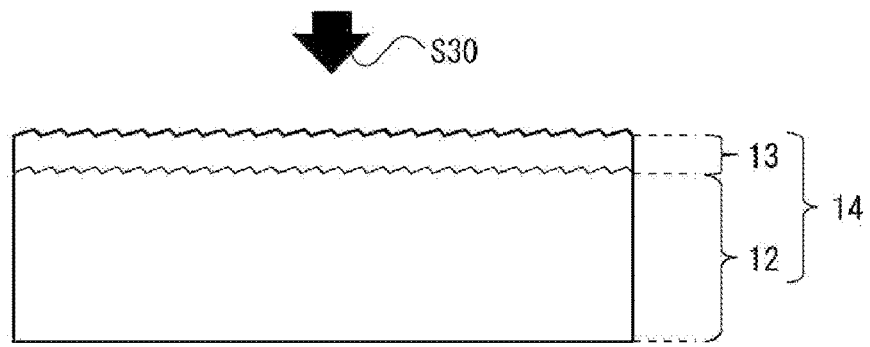
Figure 3:
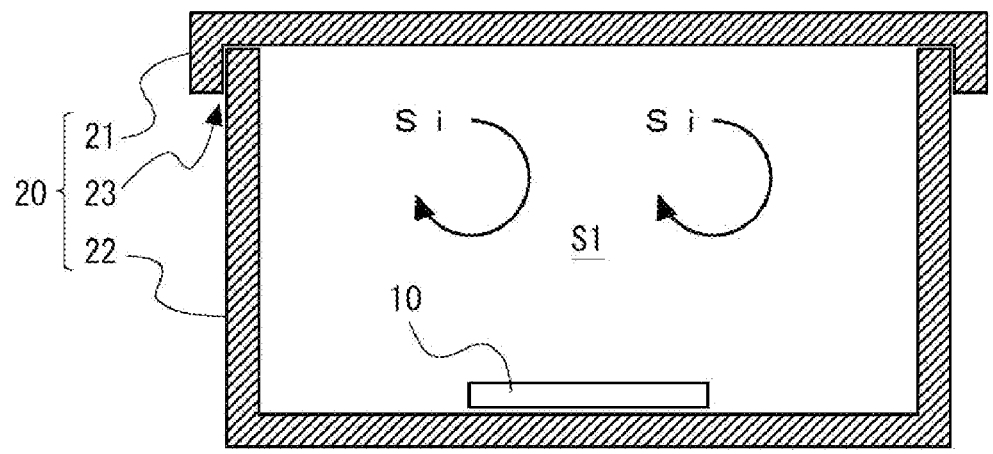
FIG. 3 is an explanatory diagram of the strained layer removal process in the manufacturing process of SiC semiconductor substrates according to one embodiment.
Figure 3:
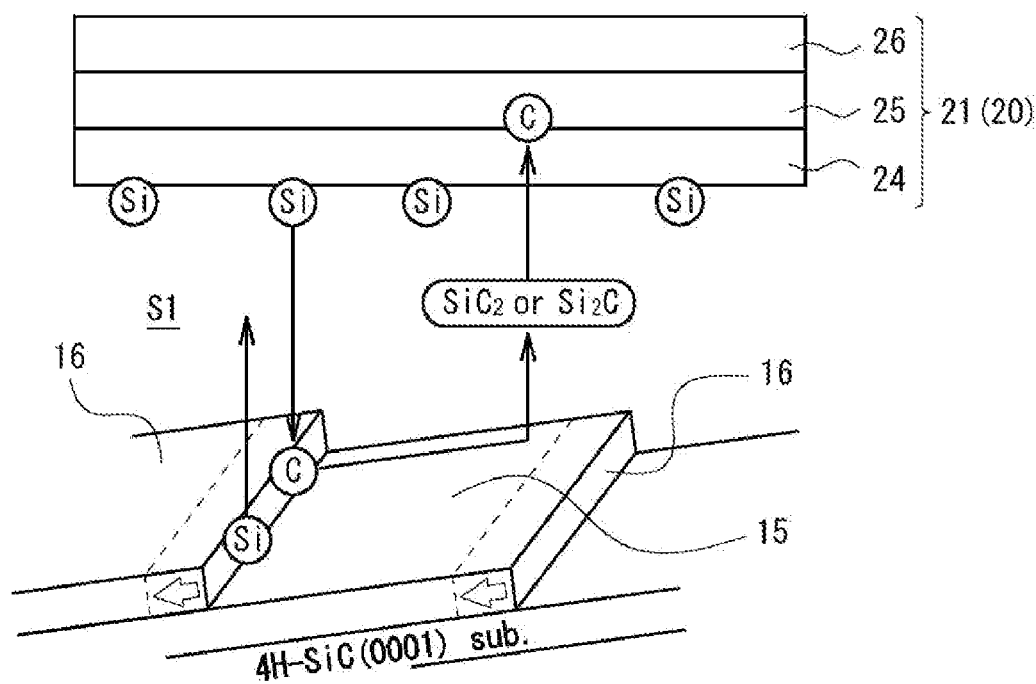

Normally, as illustrated in FIG. 2, the SiC substrate 10 which undergoes mechanical processing (slicing, polishing, and grinding) has a strained layer 11 into which processing damage such as strain 111, scratch 112, and latent scratch 113 is introduced and a bulk layer 12 into which such processing damage is not introduced.

The presence or absence of this strained layer 11 can be checked by SEM-EBSD, TEM, pXRD, or the like.

In the description in this specification, the surface (specifically, the surface on which the growth layer 13 will be deposited) of the SiC substrate 10 on which the semiconductor element will be formed is referred to as a main surface, and the surface facing the main surface is referred to as a back surface. Further, the main surface and the back surface are collectively referred to as a front surface.

Incidentally, as the main surface, a surface having an off angle of several degrees (for example, 0.4 to 8°) from (0001) surface or (000-1) surface can be exemplified. (Incidentally, in this specification, in the notation of the Miller index, "-" means a bar attached to the index immediately after that).

A step-terrace structure is checked on the surface of the SiC substrate 10 flattened at an atomic level and the SiC semiconductor substrate 14 deposited with the growth layer 13. This step-terrace structure is a staircase structure in which steps 15 which are stepped portions of one or more molecular layers and terraces 16 which are flat portions where {0001} surface is exposed are arranged alternately.

In the step 15, one molecular layer (0.25 nm) is the minimum height (minimum unit), and various step heights are formed by overlapping a plurality of the single molecular layers. In the description of this specification, the steps 15 are bundled (bunched) to become huge and have a height exceeding one unit cell of each polytype, which is called a macro step bunching (MSB).

That is, the MSB is the steps 15 which are bunched beyond four molecular layers (five or more molecular layers) in the case of 4H—SiC and the steps 15 which are bunched beyond six molecular layers (seven or more molecular layers) in the case of 6H—SiC.

<Strained Layer Removal Process>

The strained layer removal process S10 is a step of removing the strained layer 11 existing on the surface of the SiC substrate 10. Of course, the strained layer removal process S10 can be adopted as long as the method can remove the strained layer 11, and a Si vapor pressure etching method, an $H_2$ etching method, and the like can be exemplified.

Hereinafter, an embodiment of this process will be described.

(1) Si Vapor Pressure Etching Method

The Si vapor pressure etching method (SiVE: Si-Vapor Etching) is a method of etching the surface of the SiC substrate 10 by heating the SiC substrate 10 to a temperature of about 1400 to 2300° C. in a Si atmosphere.

In the Si vapor pressure etching method according to the embodiment of the present invention, as illustrated in FIG. 3(a), the SiC substrate 10 is housed in a carburizing container 20 having a C atom storage function (carburizing function) and heated. In the carburizing container 20, C atoms in the container can be taken into the carburizing container 20 from an inner wall surface, and a Si vapor pressure space S1 can be formed in the carburizing container 20. Accordingly, the SiC substrate 10 is arranged in the Si vapor pressure space S1, and etching of the surface of the SiC substrate 10 is achieved.

The carburizing container 20 may have a configuration capable of housing the SiC substrate 10 in the Si vapor pressure space S1, and includes, for example, an upper container 21 and a lower container 22 which can be fitted into the upper container 21. In the carburizing container 20, a minute gap 23 is formed in the fitting portion between the upper container 21 and the lower container 22, and the inside of the carburizing container 20 is evacuated through the gap 23.

The inner wall surface of the carburizing container 20 is configured by a plurality of layers and has a tantalum silicide layer 24 ($TaSi_2$, $Ta_5Si_3$, or the like), a tantalum carbide layer 25 (TaC and $Ta_2C$), and a tantalum layer 26 (Ta) in this order from the Si vapor pressure space S1 side to the outside.

The tantalum silicide layer 24 supplies Si atoms into the Si vapor pressure space S1 of the carburizing container 20 by heating. Further, in the carburizing container 20, the tantalum silicide layer 24, the tantalum carbide layer 25, and the tantalum layer 26 are formed from the inside, so that C atoms existing in the Si vapor pressure space S1 can be taken (carburized) into the container itself. As a result, a high-purity Si atmosphere can be formed in the Si vapor pressure space S1.

In this way, when a Si vapor pressure environment can be formed in the Si vapor pressure space S1 by taking in C atoms, it can be adopted as the carburizing container 20.

Instead of providing the tantalum silicide layer 24, a supplying source for Si atom such as a Si substrate may be arranged in the Si vapor pressure space S1. In this case, the inside of the Si vapor pressure space S1 can be formed to be a high-purity Si atmosphere by sublimating Si atoms during heating.

The atomic number ratio Si/C in the Si vapor pressure space S1 in this method can be controlled by selecting the composition of the tantalum silicide layer 24. That is, the amount of Si supplied to the Si vapor pressure space S1 of the carburizing container 20 differs depending on the composition of the tantalum silicide layer 24. For example, $Ta_5Si_3$ has a larger amount of Si supplied during heating than $Ta_5Si_2$. Therefore, by selecting $Ta_5Si_3$, the atomic number ratio Si/C in the Si vapor pressure space S1 can be increased to improve the etching rate of the SiC substrate 10.

Further, the amount of Si supplied to the Si vapor pressure space S1 differs depending on the heating temperature of the carburizing container 20. Specifically, when the temperature during heating increases, the amount of Si supplied increases, and thus the etching rate of the SiC substrate 10 can be improved.

In this way, by selecting the type of the tantalum silicide layer 24 formed in the carburizing container 20 and the heating temperature of the carburizing container 20, the Si vapor pressure amount in the Si vapor pressure space S1 can be adjusted to control the etching rate of the SiC substrate 10.

The heating temperature in this method is preferably set in a range of 1400 to 2200° C. and more preferably set in a range of 1400 to 2000° C.

As the composition of the tantalum silicide layer 24 in this method, $TaSi_2$, $Ta_5Si_3$ and the like are preferably selected, and $Ta_5Si_3$ is more preferably selected.

Figure 4:
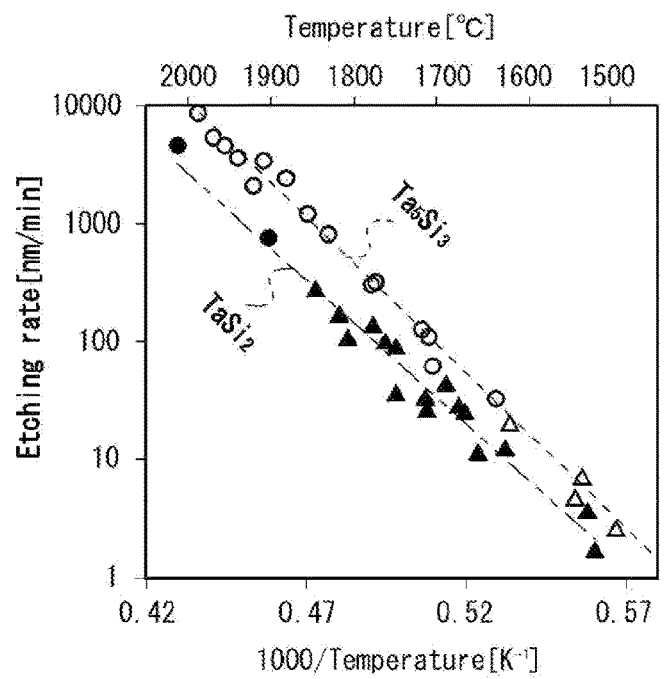
FIG. 4 is an explanatory diagram of the strained layer removal process in the manufacturing process of SiC semiconductor substrates according to one embodiment.

The etching rate in this method can be controlled by the heating temperature and the composition of the tantalum silicide layer 24 and can be set in a range of 1 to 10000 nm/min (see FIG. 4).

The etching amount in this method is set in a range in which the strained layer 11 introduced into the SiC substrate 10 can be removed. As the etching amount, 1 to 5 μm can be exemplified as the thickness of the strained layer 11 introduced into the SiC wafer after commercial CMP.

Incidentally, an etching time can be set to an arbitrary time so as to obtain a desired etching amount. For example, in a case where the etching amount is 3 μm under the condition that the etching rate is 1 μm/min, the etching time is 3 minutes.

The vacuum degree of a high-temperature vacuum furnace 40 (main heating chamber 41) used in this method is $10^{-3}$ to 10 Pa and more preferably $10^{-4}$ to $10^{-2}$ Pa.

In this method, it is also possible to introduce an inert gas during etching. Ar or the like can be selected for this inert gas, and the vacuum degree of the high-temperature vacuum furnace 40 (main heating chamber 41) can be adjusted by introducing this inert gas in a range of $10^{-5}$ to 10000 Pa.

FIG. 3(b) is an explanatory diagram illustrating an outline of an etching mechanism. By heating the Si vapor pressure space S1 in which the SiC substrate 10 is arranged in a temperature range of 1400° C. or higher and 2300° C. or lower, the following reactions 1) to 4) are continuously carried out, and as a result, it is considered that etching proceeds.

$$SiC(s) \rightarrow Si(v)I + C(s) \quad \quad 1)$$

$$Ta_xSi_y \rightarrow Si(v)II + Ta_x'Si_y' \quad \quad 2)$$

$$2C(s) + Si(v)I + II \rightarrow SiC_2(v) \quad \quad 3)$$

$$C(s) + 2Si(v)I + II \rightarrow Si_2C(v) \quad \quad 4)$$

Explanation of 1): When the SiC substrate 10 (SiC(s)) is heated under Si vapor pressure, Si atoms (Si(v)I) are desorbed from SiC by thermal decomposition.

Explanation of 2): Si vapor (Si(v)II) is supplied from the tantalum silicide layer ($Ta_xSi_y$).

Explanation of 3) and 4): C(C(s)) remaining due to the desorption of Si atom (Si(v)I) by thermal decomposition reacts with Si vapor (Si(v)I and Si(v)II) and thus is sublimated as $SiC_2C$ or $SiC_2$, or the like.

As described above, in the Si vapor pressure etching method, the Si vapor pressure amount in the Si vapor pressure space S1 can be adjusted, whereby the formation and decomposition of the MSB on the surface of the SiC substrate 10 can be controlled.

FIG. 4 is a graph illustrating a relationship between the heating temperature and the etching rate in the Si vapor pressure etching method. The horizontal axis of this graph is the reciprocal of temperature, and the vertical axis of this graph logarithmically represents the etching rate. In this graph, the results of Si vapor pressure etching using the carburizing container 20 having the tantalum silicide layer 24 of $Ta_5Si_3$ are indicated by ○ and △, and the results of Si vapor pressure etching using the carburizing container 20 having the tantalum silicide layer 24 of $TaSi_2$ are indicated by ● and ▲. Further, the conditions under which the MSB is not formed are indicated by ○ and ●, and the conditions under which the MSB is formed are indicated by △ and ▲. Further, a dashed line in FIG. 4 is the Arrhenius plot of the result of $Ta_5Si_3$ for the tantalum silicide layer 24, and a two-dot chain line is the Arrhenius plot of the result of $TaSi_2$ for the tantalum silicide layer 24.

FIG. 5(a) is an example of the portion indicated by ○ in FIG. 4, and is an SEM image on the 4H—SiC(0001) surface side which is heat-processed at 1800° C. by using the carburizing container 20 having the tantalum Silicide layer 24 of $Ta_5Si_3$. On this surface, a step-terrace structure with a terrace width of 14 nm and a step height of 1.0 nm (full unit cell) is formed, and no MSB is formed.

On the other hand, FIG. 5(b) is an example of the portion indicated by ▲ in FIG. 4, and is an SEM image on the 4H—SiC(0001) surface side which is heat-processed at 1800° C. by using the carburizing container 20 having a tantalum silicide layer 24 of $TaSi_2$. On this surface, for example, a step-terrace structure with a terrace width of 40 to 200 nm and a step height of 3 to 14 nm is formed, and an MSB is formed.

Further, the SiC substrates 10 having different terrace widths can be obtained by appropriately changing the conditions such as the heating temperature and heating time, the type of the tantalum silicide layer, and the presence or absence of the introduction of Ar gas.

Incidentally, the step height and terrace width can be checked by an atomic force microscope (AFM) or a scanning electron microscope (SEM) image contrast evaluation method described in JP 2015-179082 A.

In this way, in the Si vapor pressure etching, the Si vapor pressure amount in the Si vapor pressure space S1 can be adjusted to control the formation and decomposition of the MSB by appropriately selecting the composition of the tantalum silicide layer 24 formed in the carburizing container 20 and the heating temperature.

Further, even at the same heating temperature, the terrace width and the formation and decomposition of the MSB can be controlled.

Even under the Si vapor pressure amount condition in which the MSB can be decomposed, with the introduction of Ar gas, the etching rate can be reduced to form the MSB.

In the strained layer removal process S10 according to the present invention, the strained layer 11 can be removed from the SiC substrate 10 by adopting the Si vapor pressure etching method. In the Si vapor pressure etching method, mechanical processing is not performed, and thus a new strained layer 11 is not introduced. As a result, it is possible to obtain the SiC substrate 10 from which the strained layer 11 is removed.

In the strained layer removal process S10 according to the present invention, by adopting the Si vapor pressure etching method, the MSB existing on the surface of the SiC substrate 10 can be decomposed together with the removal of the strained layer 11.

(2) $H_2$ Etching Method

The $H_2$ etching method is a method of etching the surface of the SiC substrate 10 by heating the SiC substrate 10 to a temperature of 1400 to 1700° C. in a hydrogen atmosphere. The strained layer 11 may be removed by using this $H_2$ etching method.

Incidentally, in a case where the MSB is formed in the strained layer removal process S10, the bunching decomposition process S11 capable of decomposing the MSB may be separately performed before the epitaxial growth process S20 (see FIG. 1). In this bunching decomposition process S11, the same method as in the bunching decomposition process S30 to be described later can be adopted.

<Epitaxial Growth Process>

The epitaxial growth process S20 is a step of epitaxially growing the growth layer 13 on the SiC substrate 10 from which the strained layer 11 is removed (see FIG. 2). Of course, this epitaxial growth process S20 can be adopted as long as the SiC substrate 10 can be grown under the SiC—C equilibrium vapor pressure environment or the C-rich environment and can be exemplified by a sublimation method, a chemical vapor deposition method (CVD), or the like.

Hereinafter, an embodiment of this process will be described.

Incidentally, the terrace width W1 of the SiC substrate 10 subjected to the epitaxial growth process S20 is preferably less than 40 nm, more preferably less than 30 nm, still more preferably less than 20 nm, and still more preferably less than 15 nm.

(1) Sublimation Method

The sublimation method is a method in which a source material and a SiC substrate 10 are arranged and heated in a growth space so that a source material gas to which the source material is sublimated is transported on the SiC substrate 10 for recrystallization and growth.

In the sublimation method according to the embodiment of the present invention, the SiC substrate 10 is arranged in a supplying space for source material S2 evacuated through the Si vapor pressure space S1. That is, as illustrated in FIG. 6(a), the source material container 30 having the supplying space for source material S2 is arranged in the carburizing container 20 having the Si vapor pressure space S1, and the SiC substrate 10 is further arranged in the source material container 30.

A supplying source for Si atom and a supplying source for C atom are arranged in the supplying space for source material S2, and Si atoms and C atoms which are the source materials of the SiC substrate 10 are supplied into the supplying space for source material S2 by heating the source material container 30. The Si atoms and C atoms are transported to the surface of the SiC substrate 10 and recrystallized, so that epitaxial growth proceeds.

As the carburizing container 20, the same carburizing container 20 used in the strained layer removal process S10 can be adopted. That is, the carburizing container includes the upper container 21 and the lower container 22 that can be fitted to the upper container 21 and has the tantalum silicide layer 24 (TaSi$_2$, Ta$_5$Si$_3$, or the like) and the tantalum carbide layer 25 (TaC and Ta$_2$C), and the tantalum layer 26 (Ta) in this order from the inside to the outside. Therefore, the Si vapor pressure space S1 can be formed in the carburizing container 20 by heating.

Similarly to the carburizing container 20, the source material container 30 includes an upper container 31 and a lower container 32 which can be fitted to the upper container 31 and has the supplying space for source material S2 for growing the SiC substrate 10 in the container. At this time, a minute gap 33 is formed in the fitting portion between the upper container 31 and the lower container 32, and evacuation is made through the gap 33.

As the supplying source for Si atom and the supplying source for C atom, a material capable of supplying Si atoms such as a Si substrate, a material capable of supplying C atoms such as graphite, and a material capable of supplying Si atoms and C atoms such as a SiC substrate can be adopted. Further, by forming at least a part of the source material container 30 with polycrystalline SiC (Poly-SiC), the source material container 30 itself can be used as a supplying source for Si atom and a supplying source for C atom.

Figure 6:
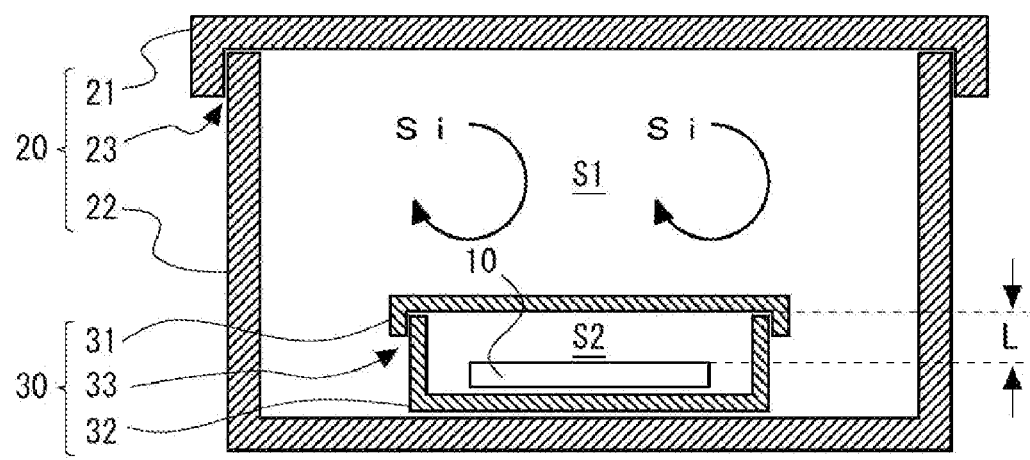
FIG. 6 is an explanatory diagram of an epitaxial growth process in the manufacturing process of SiC semiconductor substrates according to one embodiment.
Figure 6:
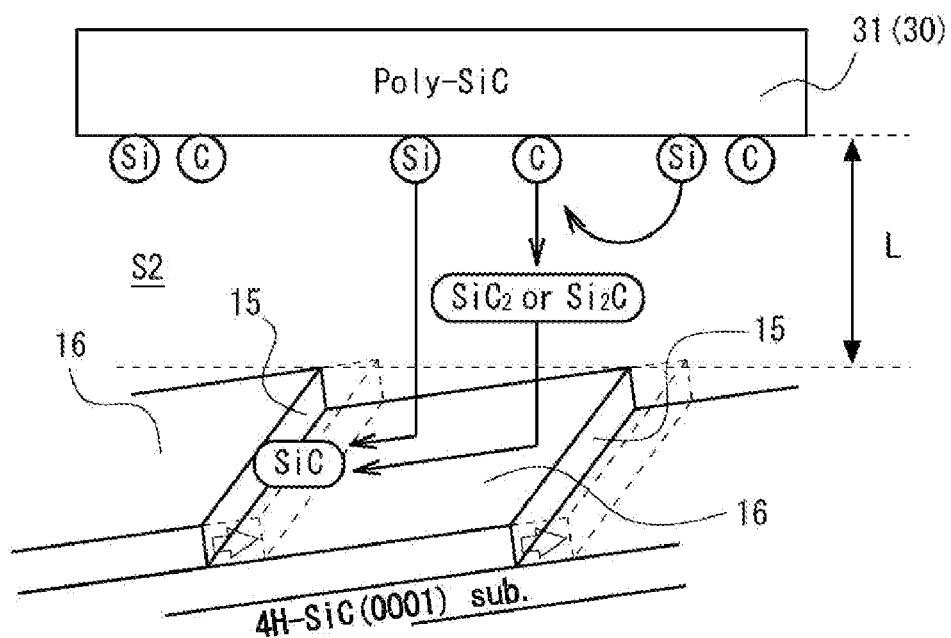

In FIG. 6(*a*), the source material container 30 made of polycrystalline SiC is adopted, and the source material container 30 supplies Si atoms and C atoms into the supplying space for source material S2. The arrangement of the supplying source for Si atom and the supplying source for C atom is not limited to this aspect, and any aspect may be used as long as the Si atom and the C atom can be supplied in the supplying space for source material S2. For example, a material other than polycrystalline SiC may be adopted for the source material container 30, and an aspect may be adopted in which a Si material, a C material, and a SiC material are arranged in the supplying space for source material S2.

Incidentally, in a case where polycrystalline SiC is used as the source material, the vapor pressure difference (chemical potential difference) between the polycrystalline SiC (source material) and the single crystal SiC (SiC substrate 10) can be used as a growth driving force.

It is desirable that a temperature gradient is provided in the supplying space for source material S2 so that the temperature decreases toward the SiC substrate 10. This temperature gradient is used as the growth driving force to cause Si atoms and C atoms to be the transported to the SiC substrate 10, so that the growth rate of the growth layer 13 increases.

That is, in the source material container 30 and the carburizing container 20, a minute amount of heat escapes from the contact portion (near the bottom surface) between a pedestal portion (moving unit 43) supporting the carburizing container 20 and the carburizing container 20, so that a slight temperature gradient is provided such that the temperature decreases toward a bottom direction (from top to bottom). This temperature gradient is used as a growth driving force to cause the source material to be transported from the upper container 31 to the SiC substrate 10, so that epitaxial growth can proceed.

Incidentally, a case where the temperature decreases from the top to the bottom is described as the temperature gradient. However, the temperature gradient is not limited thereto, and the high-temperature vacuum furnace 40 may be designed so that the temperature gradient may be formed in an arbitrary direction.

In order to efficiently cause the Si atoms and the C atoms to reach the SiC substrate 10, the supplying source for Si atom and the supplying source for C atom may be brought close to the SiC substrate 10. FIG. 6(*a*) illustrates an aspect in which the polycrystalline SiC upper container 31 serving as the supplying source for Si atom and the supplying source for C atom are arranged close to the SiC substrate 10 in parallel.

A distance L between the main surface of the SiC substrate 10 and the top surface of the upper container 31 is preferably set in a range of 0.5 to 20 mm and more preferably in a range of 0.7 to 10 mm.

In a case where this distance L is 0.5 mm or more, a temperature difference between the main surface of the SiC substrate 10 and the top surface of the upper container 31 becomes large. As a result, the growth driving force increases, and the growth rate increases.

On the other hand, in a case where the distance L is 20 mm or less, the distance between the source material and the substrate becomes short, the source material gas is efficiently transported, and the growth rate increases.

The heating temperature in this method is preferably set in a range of 1400 to 2200° C., and more preferably set in a range of 1600 to 2000° C.

The growth rate in this method can be controlled by the above temperature range and growth environment and can be selected in a range of 0.001 to 1 µm/min.

The amount of growth in this method is preferably 5 to 15 µm and more preferably 8 to 10 µm.

The growth time in this method can be set to an arbitrary time so as to achieve a desired growth amount. For example, in a case where the growth amount is desired to be 10 µm at the growth rate of 10 nm/min, the growth time may be 100 minutes.

The vacuum degree in this method (main heating chamber 41) is $10^{-3}$ to 10 Pa ad more preferably $10^{-3}$ to 1 Pa.

In this method, it is also possible to introduce an inert gas during growth. Ar or the like can be selected for this inert gas, and the vacuum degree of the high-temperature vacuum furnace 40 (main heating chamber 41) can be adjusted by introducing this inert gas in a range of $10^{-5}$ to 10000 Pa.

FIG. 6(*b*) is an explanatory diagram illustrating an outline of a growth mechanism. By heating the supplying space for source material S2 in which the SiC substrate 10 is arranged in a temperature range of 1400° C. or higher and 2200° C. or lower, the following reactions 1) to 5) are continuously carried out, and as a result, it is considered that growth proceeds.

$$\text{Poly-SiC}(s) \rightarrow \text{Si}(v) + \text{C}(s) \qquad 1)$$

$$2\text{C}(s) + \text{Si}(v) \rightarrow \text{SiC}_2(v) \qquad 2)$$

$$\text{C}(s) + 2\text{Si}(v) \rightarrow \text{Si}_2\text{C}(v) \qquad 3)$$

$$\text{Si}(v) + \text{SiC}_2(v) \rightarrow 2\text{SiC}(s) \qquad 4)$$

$$\text{Si}_2\text{C}(v) \rightarrow \text{Si}(v) + \text{SiC}(s) \qquad 5)$$

Explanation of 1): When the source material container 30 (Poly-SiC(s)) is heated, Si atoms (Si(v)) are desorbed from SiC by thermal decomposition.

Explanation of 2) and 3): C(C(s)) remaining due to desorption of Si atom (Si(v)) reacts with Si vapor (Si(v)) in the supplying space for source material S2 and thus is sublimated as $SiC_2C$, $SiC_2$, or the like into the supplying space for source material S2.

Explanation of 4) and 5): The sublimated $Si_2C$, $SiC_2$, or the like reaches (diffuse) the terrace 16 of the SiC substrate 10 due to the temperature gradient (and the chemical potential difference) and reaches the step 15, so that growth is conducted with taking over the polymorphism of the underlying SiC substrate 10 (step flow growth).

The growth environment in the growth process according to the embodiment of the present invention is characterized by a SiC—C equilibrium vapor pressure environment. Hereinafter, the SiC—C equilibrium vapor pressure environment and the SiC—Si equilibrium vapor pressure environment will be described in detail. Incidentally, the SiC—C equilibrium vapor pressure environment and the SiC—Si equilibrium vapor pressure environment in this specification include a near thermal equilibrium vapor pressure environment that satisfies a relationship between the growth rate and the growth temperature derived from a theoretical thermal equilibrium environment.

The SiC—Si equilibrium vapor pressure environment refers to the environment of vapor pressure when three phases of SiC (solid phase), Si (liquid phase), and a gas phase are in equilibrium.

In other words, the "SiC—Si vapor pressure environment" in this specification refers to the environment of vapor pressure when SiC (solid) and Si (liquid phase) are in phase equilibrium state through a gas phase.

The SiC—Si equilibrium vapor pressure environment is formed, for example, by heat-processing a semi-closed space having an atomic number ratio Si/C exceeding 1. Specifically, in a case where the SiC substrate 10 that satisfies the stoichiometric ratio 1:1 and the Si vapor supply source (Si substrates, Si pellets, or the like) are arranged in the SiC source material container 30 that satisfies the stoichiometric ratio 1:1, the atomic number ratio Si/C in the source material container 30 exceeds 1.

Incidentally, the term "semi-closed space" in this specification refers to a space in which the inside of the container can be vacuumed, but at least a part of the vapor generated in the container can be confined. This semi-closed space can be formed in the source material container 30 or the carburizing container 20.

The SiC—C equilibrium vapor pressure environment refers to the environment of vapor pressure when three phases of SiC (solid phase), C (solid phase), and a gas phase are in equilibrium.

In other words, the "SiC—C equilibrium vapor pressure environment" in this specification refers to the environment of vapor pressure when SiC (solid phase) and C (solid phase) are in phase equilibrium state through a gas phase.

The SiC—C equilibrium vapor pressure environment is formed, for example, by heat-processing a semi-closed space having an atomic number ratio Si/C of 1 or less. Specifically, in a case where the SiC substrate 10 that satisfies the stoichiometric ratio 1:1 is arranged in the SiC source material container 30 that satisfies the stoichiometric ratio 1:1, the atomic number ratio Si/C in the source material container 30 becomes 1. Further, a C vapor supply source (C pellets or the like) may be arranged to set the atomic number ratio Si/C to 1 or less.

The atomic number ratio Si/C in the gas phase of the SiC—C equilibrium vapor pressure environment is smaller than the atomic number ratio Si/C in the gas phase of the SiC—Si equilibrium vapor pressure environment.

In this method, under the condition that the vapor pressure environment between the SiC source material and the SiC substrate becomes the SiC—C equilibrium vapor pressure environment, the vapor pressure difference (chemical potential difference) between the polycrystalline SiC (SiC source material) and the single crystal SiC (SiC substrate 10) or the temperature gradient is used as the growth driving force to grow the SiC substrate 10.

Herein, in a case where the vapor pressure difference between the SiC source material and the SiC substrate is used as the growth amount, the growth rate of SiC can be obtained by the following equation 1.

$$\text{GROWTH RATE } (m/s) \propto \sum_{i=SiC, Si_2C, SiC_2} \frac{(P_{SOURCE\ MATERIALi} - P_{SUBSTRATEi})}{\sqrt{2\pi m_i kT}} \quad \text{[Equation 1]}$$

Herein, T is a temperature on the SiC source material side, $m_i$ is the mass of one molecule of a gas phase species ($Si_xC_y$), and k is the Boltzmann constant.

Further, the $P_{source\ materiali} - P_{substratei}$ is the amount of growth precipitated as SiC when the source material gas becomes supersaturated, and SiC, $SiC_2C$, and $SiC_2$ are assumed as the source material gas.

In this method, the SiC—C equilibrium vapor pressure environment can be formed by arranging the supplying source for Si atom and the supplying source for C atom so that the atomic number ratio Si/C in the supplying space for source material S2 is 1 or less. On the other hand, the SiC—Si equilibrium vapor pressure environment is formed by the arrangement in which the atomic number ratio Si/C in the supplying space for source material S2 exceeds 1.

Figure 7:
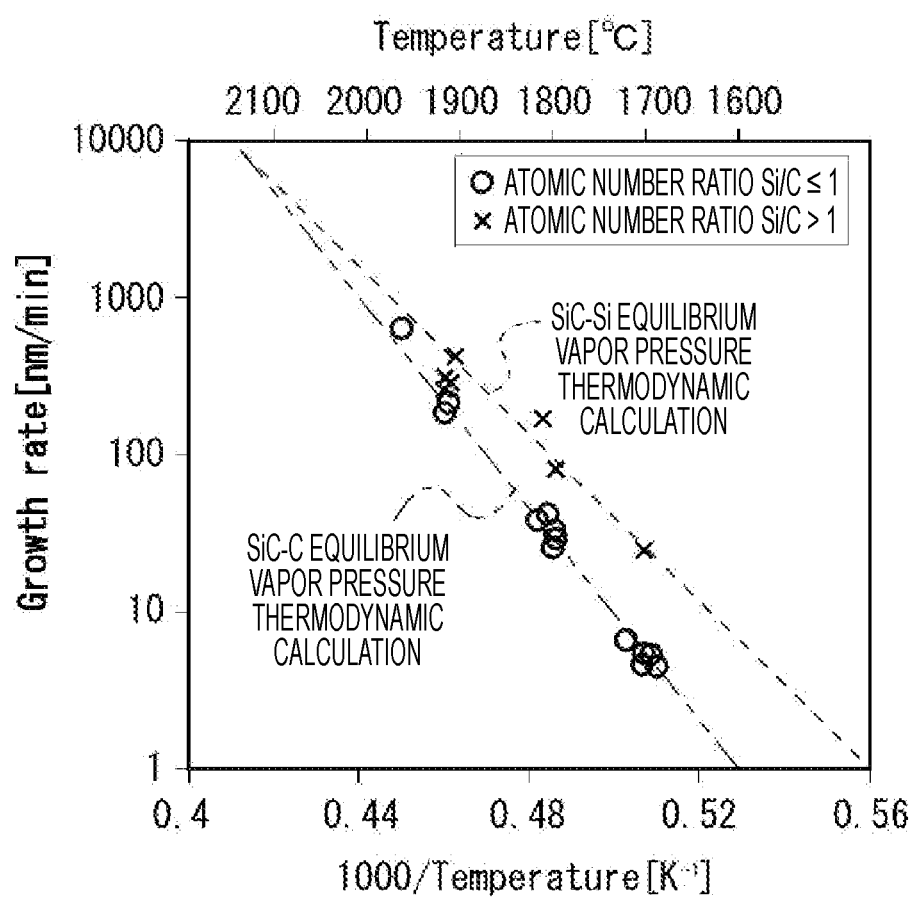
FIG. 7 is an explanatory diagram of the epitaxial growth process in the manufacturing process of SiC semiconductor substrates according to one embodiment.

FIG. 7 is a graph illustrating the relationship between the heating temperature and the growth rate in the growth by the manufacturing method of SiC semiconductor substrates according to the present invention. The horizontal axis of this graph is the reciprocal of temperature, and the vertical axis of this graph logarithmically represents the growth rate. The result of arrangement and growth for the atomic number ratio Si/C of 1 or less in the supplying space for source material S2 is indicated by ◯, and the result of arrangement and growth for the atomic number ratio Si/C exceeding 1 in the supplying space for source material S2 is indicated by X.

In the graph of FIG. 7, the result of the thermodynamic calculation of SiC substrate growth in the SiC—Si equilibrium vapor pressure environment is indicated by a dashed line (Arrhenius plot), and the result of the thermodynamic calculation of SiC substrate growth in the SiC—C equilibrium vapor pressure environment is indicated by a two-dot chain line (Arrhenius plot).

That is, the dashed line indicates the result of thermodynamic calculation when single crystal SiC is grown with polycrystalline SiC as the source material in the vapor pressure environment in which three phases of SiC (solid phase), Si (liquid phase), and a gas phase are in equilibrium. Specifically, the thermodynamic calculation was performed under the following conditions (i) to (iv) using Equation 1. (i) A SiC+Si system with a constant volume, (ii) the growth driving force is the temperature gradient in the supplying space for source material S2 and the vapor pressure difference (chemical potential difference) between polycrystalline SiC and single crystal SiC, (iii) the source material gas is SiC, $SiC_2C$, and $SiC_2$, and (iv) the adsorption coefficient for adsorbing the source material into the step 15 is 0.001.

The two-dot chain line indicates the result of thermodynamic calculation when single crystal SiC is grown with polycrystalline SiC as the source material in the vapor pressure environment in which three phases of SiC (solid phase), C (solid phase), and a gas phase are in equilibrium. Specifically, the thermodynamic calculation was performed under the following conditions (i) to (iv) using Equation 1. (i) A SiC+C system with a constant volume, (ii) the growth driving force is the temperature gradient in the supplying space for source material S2 and the vapor pressure difference (chemical potential difference) between polycrystalline SiC and single crystal SiC, (iii) the source material gas is SiC, $SiC_2C$, and $SiC_2$, and (iv) the adsorption coefficient for adsorbing the source material into the step 15 is 0.001.

Incidentally, the values in the JANAF thermochemical table were adopted for the data of each chemical species used in the thermodynamic calculation.

FIG. 8(a) is an SEM image on the 4H—SiC(0001) surface side when the SiC substrate 10 is arranged so that the atomic number ratio Si/C in the supplying space for source material S2 is 1 or less and is subjected to the epitaxial growth at 1800° C. That is, FIG. 8(a) is an example of the portion indicated by ○ in FIG. 7 and is an example of the surface of the SiC substrate 10 grown in the SiC—C equilibrium vapor pressure environment. On this surface, for example, a step-terrace structure with a terrace width of 40 to 200 nm and a step height of 3 to 14 nm is formed, and an MSB having the zigzag-shaped step end is formed.

On the other hand, FIG. 8(b) is an SEM image on the 4H—SiC(0001) surface side when the SiC substrate 10 is arranged so that the atomic number ratio Si/C in the supplying space for source material S2 exceeds 1 or less and is subjected to the epitaxial growth at 1800° C. That is, FIG. 8(b) is an example of the portion indicated by X in FIG. 7 and is an example of the surface of the SiC substrate 10 grown in the SiC—Si equilibrium vapor pressure environment. On this surface, a step-terrace structure with a terrace width of 14 nm and a step height of 1.0 nm (full unit cell) is formed, and no MSB is formed.

Incidentally, the step height and the terrace width can be checked by an AFM or the SEM image contrast evaluation method described in JP 2015-179082 A.

(2) CVD Method

The CVD method is a method of forming the growth layer 13 on the SiC substrate 10 by heating the SiC substrate 10 to a temperature of 1400 to 1700° C. and supplying $SiH_4$ gas and $C_3H_8$ gas using hydrogen gas as a carrier gas. In this CVD method, the atomic number ratio Si/C in the growth environment can be controlled by the supply amount of $SiH_4$ gas and $C_3H_8$ gas. Therefore, the SiC substrate 10 can be grown under the C-rich environment. Incidentally, the C-rich environment in this specification means that the atomic number ratio Si/C of the source material gas during growing is 1 or less.

In this CVD method, in a case where the SiC substrate is grown under the C-rich environment, the surface on which the MSB is formed as illustrated in FIG. 8(a) can be obtained.

<Bunching Decomposition Process>

The bunching decomposition process S30 is a process of decomposing the MSB formed on the surface of the SiC semiconductor substrate 14 (see FIG. 2). In the manufacturing method of SiC semiconductor substrates according to one embodiment of the present invention, the above-described Si vapor pressure etching method or sublimation method can be adopted as the bunching decomposition process S30. Further, in addition to these methods, of course, any method can be adopted as long as the MSB can be decomposed.

(1) Si Vapor Pressure Etching Method

The MSB formed in the epitaxial growth process S20 can be decomposed by performing etching based on the Si vapor pressure etching method under the conditions indicated by ○ and ● in FIG. 4 (see FIG. 5(a)).

(2) Sublimation Method

Figure 8:
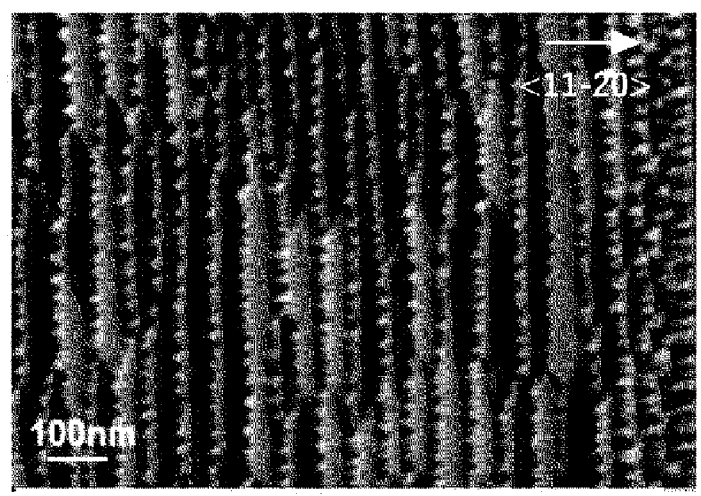
FIG. 8 is an explanatory diagram of the epitaxial growth process in the manufacturing process of SiC semiconductor substrates according to one embodiment.
Figure 8:
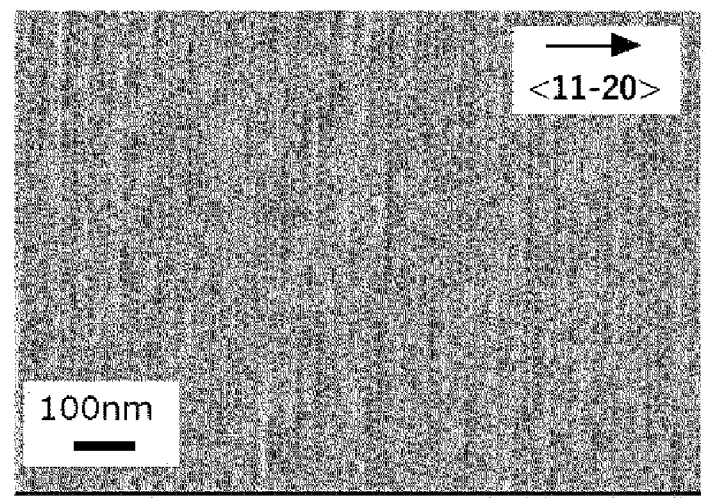

The MSB formed in the epitaxial growth process S20 can be decomposed by conducting epitaxial growth based on the sublimation method under the conditions indicated by X in FIG. 8 (see FIG. 8(b)).

As described above, in the bunching decomposition process S30, the MSB formed in the epitaxial growth process S20 can be decomposed by adopting a proximity sublimation method or the Si vapor pressure etching method. Incidentally, the bunching decomposition process S30 can be performed using the same manufacturing device as in the strained layer removal process S10 and the epitaxial growth process S20, and the SiC semiconductor substrate 14 from which the MSB is removed can be manufactured.

<BPD Conversion Rate in Growth Layer>

Figure 9:
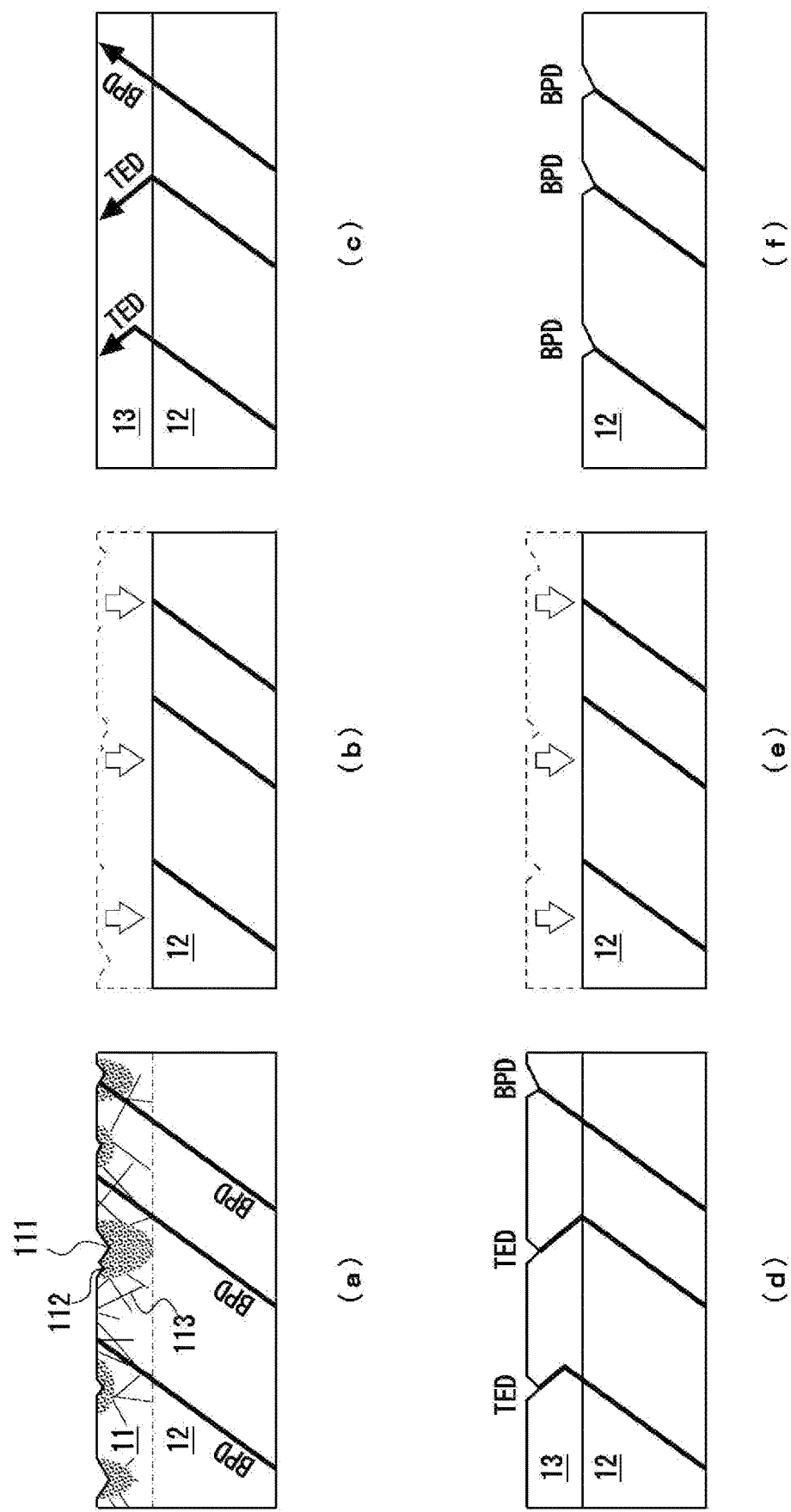
FIG. 9 is an explanatory diagram of a method for obtaining a BPD conversion rate in the manufacturing process of SiC semiconductor substrates according to one embodiment.

FIG. 9 is an explanatory diagram of a method for obtaining the conversion rate of converting the BPD into other defects/dislocations (TED or the like) during the epitaxial growth process S20.

FIG. 9(a) illustrates the SiC substrate 10 having the strained layer 11. At this stage, the BPD exists from the bulk layer 12 to the strained layer 11.

FIG. 9(b) illustrates the SiC substrate 10 from which the strained layer 11 is removed by the strained layer removal process S10. At this stage, BPD exists in the bulk layer 12.

FIG. 9(c) illustrates the SiC semiconductor substrate 14 in which the growth layer 13 is grown by the epitaxial growth process S20. In this process, the BPD existing in the bulk layer 12 is converted to TED with a certain probability. Herein, the TED and the BPD are mixed on the surface of the growth layer 13 unless 100% conversion is performed.

FIG. 9(d) illustrates an aspect in which defects in the growth layer 13 are checked by using a KOH dissolution etching method on the SiC semiconductor substrate 14 after the epitaxial growth process S20. This KOH dissolution etching method is a method in which a SiC substrate is immersed in a molten salt (such as KOH) heated to about 500° C., etch pits are formed in dislocations and defective portions, and the type of dislocation is determined by the size and shape of the etch pits. By this method, the number of BPDs propagating in the growth layer 13 after the epitaxial growth process S20 is obtained.

FIG. 9(e) illustrates an aspect in which the growth layer 13 is removed after the KOH dissolution etching method. In this method, after flattening to the depth of the etch pit by mechanical polishing, CMP, or the like, the growth layer 13 is removed by the Si vapor pressure etching method to expose the bulk layer 12.

FIG. 9(f) illustrates an aspect in which, in the bulk layer 12 from which the growth layer 13 is removed, the defects in the bulk layer 12 are checked by using the KOH dissolution etching method. By this method, the number of BPDs existing in the bulk layer 12 immediately below the growth layer 13 is obtained.

According to the sequence illustrated in FIG. 9, when the number of BPDs propagating in the growth layer 13 in FIG. 9(d) is compared with the number of BPDs existing on the surface of the bulk layer 12 in FIG. 9(f), it is possible to obtain the BPD conversion rate at which BPDs are converted to other defects/dislocations during the epitaxial growth process S20.

According to the manufacturing method of SiC semiconductor substrates of the present invention, the strained layer removal process S10 of removing the strained layer 11 introduced on the surface of the SiC substrate 10 and the epitaxial growth process S20 of growing the SiC substrate 10 under the SiC—C equilibrium vapor pressure environment are included so that the BPD conversion rate in the growth layer 13 can be improved.

According to the manufacturing method of SiC semiconductor substrates of the present invention, in the epitaxial growth process S20, the BPD conversion rate in the growth layer 13 is set to approximately 100% by epitaxially growing the SiC substrate 10 on which the MSB is not formed.

According to the manufacturing method of SiC semiconductor substrates of the present invention, the bunching decomposition process S30 of decomposing the MSB is further included after the epitaxial growth process S20. Accordingly, it is possible to provide the SiC semiconductor substrate 14 which suppresses the occurrence of defects due to step bunching on the surface of the epi layer serving as a pressure resistant layer. Further, it is possible to provide the SiC semiconductor substrate 14 from which the MSB, which has a fatal effect on the operating performance and reliability of the MOSFET, is removed.

According to the manufacturing method of SiC semiconductor substrates of the present invention, the epitaxial growth process S20 of growing the SiC substrate 10 under the SiC—C equilibrium vapor pressure environment is included so that the BPD conversion rate in the growth layer 13 can be improved.

According to the manufacturing method of SiC semiconductor substrates of the present invention, in the epitaxial growth process, epitaxial growth is conducted on the SiC substrate having a terrace width of less than 40 nm. In this way, by growing the SiC substrate having a terrace width of less than 40 nm in the SiC—C equilibrium vapor pressure environment, growth can be conducted while increasing the terrace width of the SiC substrate.

In the manufacturing method of SiC semiconductor substrates which includes the epitaxial growth process S20 of growing single crystal SiC on the SiC substrate 10, the present invention is a method which includes the epitaxial growth process of conducting growth under the condition that the terrace width W of the SiC substrate 10 increases and reduces the basal plane dislocations of the SiC semiconductor substrate.

In the manufacturing method of SiC semiconductor substrates which includes the epitaxial growth process S20 of growing single crystal SiC on the SiC substrate 10, the present invention is a method which includes the epitaxial growth process of epitaxially growing the SiC substrate 10 under the SiC—C equilibrium vapor pressure environment and reduces the basal plane dislocation of the SiC semiconductor substrate.

[SiC Semiconductor Substrate]

The SiC semiconductor substrate 14 according to one embodiment of the present invention includes the bulk layer 12 having BPD and the growth layer 13 in which the BPD is converted into dislocations/defects other than the BPD, and the conversion rate of the BPD in the growth layer 13 is approximately 100%. Specifically, the conversion rate is larger than 99.95%, preferably 99.96% or more, preferably 99.97% or more, preferably 99.98% or more, and preferably 99.99% or more.

That is, in the SiC semiconductor substrate 14 has the growth layer 13 in which the BPD does not exist on the surface since the BPD existing in the bulk layer 12 is converted into other dislocations/defects during the epitaxial growth process S20.

Specifically, in the SiC semiconductor substrate 14, the BPD density of the bulk layer 12 is 2000 pieces/cm$^2$ or more, and the BPD density of the surface of the growth layer 13 is less than 1 piece/cm$^2$.

For example, in the SiC semiconductor substrate 14 of the present invention, in an area of 10 mm×5 mm, the number of BPDs on the surface of the bulk layer 12 is 1200 or more, and the number of BPDs on the surface of the growth layer 13 is zero.

That is, in the SiC semiconductor substrate 14, the BPD density of the bulk layer 12 is 2400 pieces/cm$^2$ or more, and the BPD density of the surface of the growth layer 13 is 0 piece/cm$^2$.

The SiC semiconductor substrate 14 according to another embodiment of the present invention includes the bulk layer 12 having BPD and the growth layer 13 in which the BPD is converted into other than the BPD, and the BPD conversion rate in the growth layer 13 is more than 99.5%.

Specifically, in the SiC semiconductor substrate 14, the BPD density of the bulk layer 12 is 1000 pieces/cm$^2$ or more, and the BPD density of the surface of the growth layer 13 is less than 5 piece/cm$^2$.

For example, in the SiC semiconductor substrate 14 according to another embodiment of the present invention, in an area of 10 mm×5 mm, the number of BPDs on the surface of the bulk layer 12 is 669 or more, and the number of BPDs on the surface of the growth layer 13 is two or less. That is, in the SiC semiconductor substrate 14, the BPD density of the bulk layer 12 is 1338 pieces/cm$^2$ or more, and the BPD density of the surface of the growth layer 13 is 4 piece/cm$^2$ or less.

The SiC semiconductor substrate 14 according to another embodiment of the present invention includes the bulk layer 12 having BPD and the growth layer 13 in which the BPD is converted into other than the BPD, and the BPD conversion rate in the growth layer 13 is more than 95%.

Specifically, in the SiC semiconductor substrate 14, the BPD density of the bulk layer 12 is 2000 pieces/cm$^2$ or more, and the BPD density of the surface of the growth layer 13 is 100 piece/cm$^2$ or less.

Further, in the SiC semiconductor substrate 14, the BPD density of the bulk layer 12 is 1000 pieces/cm$^2$ or more, and the BPD density of the surface of the growth layer 13 is 50 piece/cm$^2$ or less.

Further, in the SiC semiconductor substrate 14, the BPD density of the bulk layer 12 is 500 pieces/cm$^2$ or more, and the BPD density of the surface of the growth layer 13 is 25 piece/cm$^2$ or less.

Further, in the SiC semiconductor substrate 14, the BPD density of the bulk layer 12 is 100 pieces/cm$^2$ or more, and the BPD density of the surface of the growth layer 13 is 5 piece/cm$^2$ or less.

For example, in the SiC semiconductor substrate 14 according to another embodiment of the present invention, in an area of 10 mm×5 mm, the number of BPDs on the surface of the bulk layer 12 is 1200 or more, and the number of BPDs on the surface of the growth layer 13 is zero. That is, in the SiC semiconductor substrate 14, the BPD density of the bulk layer 12 is 2400 pieces/cm$^2$ or more, and the BPD density of the surface of the growth layer 13 is 0 piece/cm$^2$.

Further, in the SiC semiconductor substrate 14 according to another embodiment of the present invention, in an area of 10 mm×5 mm, the number of BPDs on the surface of the bulk layer 12 is 669 or more, and the number of BPDs on the surface of the growth layer 13 is two. That is, in the SiC semiconductor substrate 14, the BPD density of the bulk layer 12 is 1338 pieces/cm² or more, and the BPD density of the surface of the growth layer 13 is 4 piece/cm² or less.

For example, in the SiC semiconductor substrate 14 according to another embodiment of the present invention, in an area of 10 mm×5 mm, the number of BPDs on the surface of the bulk layer 12 is 276 or more, and the number of BPDs on the surface of the growth layer 13 is 12. That is, in the SiC semiconductor substrate 14, the BPD density of the bulk layer 12 is 552 pieces/cm² or more, and the BPD density of the surface of the growth layer 13 is 24 piece/cm² or less.

For example, in the SiC semiconductor substrate 14 according to another embodiment of the present invention, in an area of 10 mm×5 mm, the number of BPDs on the surface of the bulk layer 12 is 62 or more, and the number of BPDs on the surface of the growth layer 13 is two. That is, in the SiC semiconductor substrate 14, the BPD density of the bulk layer 12 is 124 pieces/cm² or more, and the BPD density of the surface of the growth layer 13 is 4 piece/cm² or less.

Figure 5:
FIG. 5 is an explanatory diagram of the strained layer removal process in the manufacturing process of SiC semiconductor substrates according to one embodiment.
Figure 5:
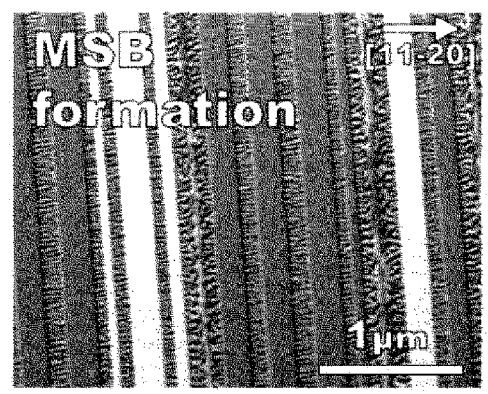

According to the SiC semiconductor substrate of the present invention, the surface of the bulk layer 12 is arranged with the steps 15 having a height of one unit cell. That is, as illustrated in FIG. 5(*a*), it is characterized in that the epitaxial growth is conducted on the surface arranged with the steps 15 having a height of 1 nm (one unit cell). The step height and terrace width of the bulk layer 12 can be checked by a cross-sectional SEM image of the SiC semiconductor substrate 14.

When the steps 15 having the same height are arranged on the surface of the bulk layer 12 in this way, the conversion rate of BPD in the growth layer 13 can be made more than 99.95%.

According to the SiC semiconductor substrate of the present invention, the steps 15 having a height of one unit cell are arranged on the surface of the growth layer 13. The step height and the terrace width can be checked by the AFM or the SEM image contrast evaluation method described in JP 2015-179082 A. Further, an epi layer serving as a pressure resistant layer may be further formed on the growth layer 13 by using the sublimation method, the CVD method or the like.

[Manufacturing Device of SiC Semiconductor Substrates]

Figure 10:
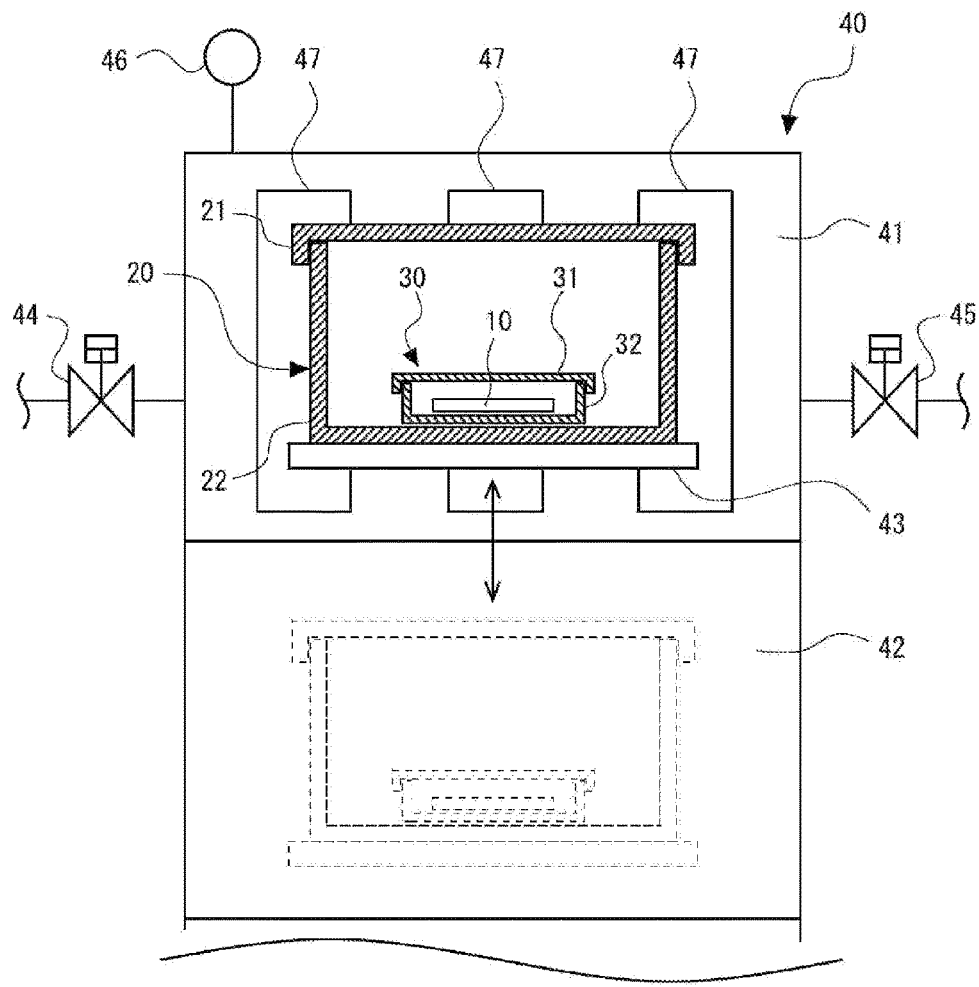
FIG. 10 is a schematic diagram of a high-temperature vacuum furnace used in the manufacturing process of SiC semiconductor substrates according to one embodiment.

Hereinafter, a manufacturing device of SiC semiconductor substrates according to the present invention will be described in detail with reference to FIG. 10. The manufacturing device according to this embodiment includes the carburizing container 20 which has the Si vapor pressure space S1, the source material container 30 which has the supplying space for source material S2, and the high-temperature vacuum furnace 40 which is capable of heating the supplying space for source material S2. Incidentally, in the same embodiment, the same reference signs are given to the components that are basically the same as the above-described SiC semiconductor substrate and the manufacturing method thereof, and the description thereof will be simplified.

The supplying space for source material S2 has a supplying source for Si atom and a supplying source for C atom, and the supplying source for Si atom and the supplying source for C atom are arranged such that an atomic number ratio Si/C in the supplying space for source material S2 is 1 or less. Accordingly, the SiC—C equilibrium vapor pressure environment can be formed in the supplying space for source material S2 to grow the SiC substrate 10.

The high-temperature vacuum furnace 40 includes the main heating chamber 41, a preheating chamber 42, and the moving unit 43 (moving table) capable of moving the carburizing container 20 from the preheating chamber 42 to the main heating chamber 41. The main heating chamber 41 can heat the SiC substrate 10 to a temperature of 1000° C. or higher and 2300° C. or lower. The preheating chamber 42 is a space for preheating the SiC substrate 10 before heating in the main heating chamber 41.

A vacuum forming valve 44, an inert gas injection valve 45, and a vacuum gauge 46 are connected to the main heating chamber 41. The vacuum forming valve 44 is connected to a vacuum pump which evacuates and vacuums the inside of the main heating chamber 41, and the vacuum degree in the main heating chamber 41 can be adjusted. Further, by introducing an inert gas (for example, Ar or the like) into the main heating chamber 41, the inert gas injection valve 45 can adjust the pressure. The vacuum gauge 46 can measure the vacuum degree in the main heating chamber 41.

A heater 47 is provided inside the main heating chamber 41. Further, a heat-reflecting metal plate is fixed to the side wall and ceiling of the main heating chamber 41 (not illustrated), and the heat-reflecting metal plate is configured to reflect the heat of the heater 47 toward the substantially central portion of the main heating chamber 41.

Accordingly, the SiC substrate 10 can be heated such that the temperature is raised to 1000° C. or higher to 2300° C. or lower. Incidentally, as the heater 47, for example, a resistance heating type heater or a high-frequency induction heating type heater can be used.

The preheating chamber 42 is configured to be connected to the main heating chamber 41 such that the carburizing container 20 can be moved by the moving unit 43. Accordingly, the supplying space for source material S2 is conveyed from the main heating chamber 41 to the preheating chamber 42 or from the preheating chamber 42 to the main heating chamber 41.

Incidentally, unlike the main heating chamber 41, the preheating chamber 42 is not provided with the heater 47, and the temperature thereof is raised by the residual heat of the main heating chamber 41. For example, in a case where the temperature of the main heating chamber 41 is 2000° C., the preheating chamber 42 is configured such that the temperature is raised to about 1000° C., and degasification processing is performed on the carburizing container 20 and the like.

Since the conveyance between the main heating chamber 41 and the preheating chamber 42 is completed in about 1 minute at the shortest by the moving unit 43, it is possible to raise and decrease the temperature at 1 to 1000° C./min. Since the rapid temperature rise and the rapid temperature decrease can be performed in this way, it is possible to observe a surface shape having no history of low temperature growth during temperature rise and temperature decrease, which is difficult with conventional devices.

Further, in FIG. 5, the preheating chamber 42 is arranged below the main heating chamber 41. However, the present invention is not limited to this, and the preheating chamber 42 may be installed in an arbitrary direction.

The moving unit 43 is a table on which the carburizing container 20 is arranged, and a minute amount of heat is released from the contact portion with the carburizing container 20. Accordingly, a temperature gradient is formed in the carburizing container 20 or in the supplying space for source material S2 to serve as a growth driving force for the SiC substrate 10. As illustrated in FIG. 5, in a case where the carburizing container 20 is supported from below, the temperature gradient is provided such that the temperature decreases toward a bottom surface direction (from top to bottom) of the carburizing container 20.

Incidentally, the temperature gradient can be provided in an arbitrary direction by changing the design of the moving unit 43. For example, in a case where a hanging type or the like is adopted for the moving unit 43, heat is released in an upper direction, and thus in the temperature gradient, a slight temperature gradient is provided such that the temperature decreases toward the top surface direction (from bottom to top) of the carburizing container 20.

According to the manufacturing device of the SiC semiconductor substrate of the present invention, the source material container 30 is arranged in the Si vapor pressure space S1 in which the Si vapor pressure environment is formed. In this way, when the supplying space for source material S2 is arranged in the Si vapor pressure space S1, and the supplying space for source material S2 is evacuated (vacuumed) through the Si vapor pressure space S1, Si atoms can be suppressed from decreasing from the supplying space for source material S2. Accordingly, the atomic number ratio Si/C which is preferable for growth can be maintained for a long time in the supplying space for source material S2.

That is, in a case where evacuation is directly made from the supplying space for source material S2, Si atoms are exhausted from the fitting portion (gap 33) between the upper container 31 and the lower container 32. In this case, the atomic number ratio Si/C in the supplying space for source material S2 is significantly reduced, so that an environment suitable for growth is not maintained.

On the other hand, in a case where the inside of the source material container 30 is evacuated through the Si vapor pressure space S1 in the Si vapor pressure environment, Si atoms is suppressed from being exhausted from the supplying space for source material S2, so that the atomic number ratio Si/C in the supplying space for source material S2 can be maintained.

Examples

Hereinafter, the present invention will be described in more detail with reference to examples, but the present invention is not limited to these examples.

The SiC semiconductor substrates of Examples 1 to 4 and Comparative Example 1 were manufactured under the conditions shown in table 1. Incidentally, the depth of the strained layer 11 of the SiC substrate 10 used in these examples and comparative examples was checked by SEM-EBSD to be about 5 μm. Further, the size of the used carburizing container 20 is 160 mm in diameter×60 mm in height, and the size of the source material container 30 is 60 mm in diameter×4 mm in height.

Incidentally, as the value of the terrace width W (including the terrace width W1 and the terrace width W2), a line perpendicular to the step 15 of the captured SEM image was drawn, and the number of the steps 15 existing on this line was counted, whereby the average value of the terrace width was adopted (terrace width W=line length/number of steps on the line).

Further, the step height was measured by the AFM.

TABLE 1

| | | EXAMPLE 1 | EXAMPLE 2 | EXAMPLE 3 |
|---|---|---|---|---|
| SiC SUBSTRATE 10 BEFORE STRAINED LAYER REMOVAL PROCESS S10 | POLYTYPE | 4H—SiC | 4H—SiC | 4H—SiC |
| | OFF ANGLE (OFF DIRECTION) | 4° OFF (<11-20> DIRECTION) | 4° OFF (<11-20> DIRECTION) | 4° OFF (<11-20> DIRECTION) |
| | SUBSTRATE SIZE [mm] | 10 × 5 | 10 × 5 | 10 × 5 |
| | PRESENCE OR ABSENCE OF MSB | ABSENCE OF MSB | ABSENCE OF MSB | ABSENCE OF MSB |
| | SURFACE FINISHING | CMP | CMP | CMP |
| | HEIGHT OF STEP 15 [nm] | 0.25 to 1 | 0.25 to 1 | 0.25 to 1 |
| | WIDTH OF TERRACE 16 [nm] | 7 | 7 | 7 |
| | PRESENCE OR ABSENCE OF STRAINED LAYER 11 | PRESENCE OF STRAINED LAYER 11 | PRESENCE OF STRAINED LAYER 11 | PRESENCE OF STRAINED LAYER 11 |
| CONDITIONS OF Si VAPOR PRESSURE ETCHING METHOD (STRAINED LAYER REMOVAL PROCESS S10) | HEATING TEMPERATURE [° C.] | 1800 | 1800 | — |
| | ETCHING TIME [min] | 60 | 600 | — |
| | ETCHING AMOUNT [um] | 20 | 8 | — |
| | TANTALUM SILICIDE LAYER | Ta$_5$Si$_3$ | Ta$_5$Si$_3$ | — |
| | Ar GAS [Pa] | — | 10000 | — |
| SiC SUBSTRATE 10 BEFORE EPITAXIAL GROWTH PROCESS S20 | PRESENCE OR ABSENCE OF STRAINED LAYER 11 | ABSENCE OF STRAINED LAYER 11 | ABSENCE OF STRAINED LAYER 11 | PRESENCE OF STRAINED LAYER 11 |
| | PRESENCE OR ABSENCE OF MSB | ABSENCE OF MSB | PRESENCE OF MSB | ABSENCE OF MSB |
| | HEIGHT OF STEP 15 [nm] | 1.0 | >1.0 | 0.25 to 1 |
| | TERRACE WIDTH W1 [nm] | 14 | 26 | 7 |
| CONDITIONS OF SUBLIMATION METHOD (EPITAXIAL GROWTH PROCESS S20) | GROWTH TEMPERATURE[° C.] | 1800 | 1800 | 1800 |
| | GROWTH TIME [min] | 360 | 360 | 360 |
| | GROWTH AMOUNT [um] | 10 | 10 | 10 |
| | Si SUBSTRATE AMOUNT [g] | NONE | NONE | NONE |
| | GROWTH ENVIRONMENT | SiC—C EQUILIBRIUM VAPOR PRESSURE ENVIRONMENT | SiC—C EQUILIBRIUM VAPOR PRESSURE ENVIRONMENT | SiC—C EQUILIBRIUM VAPOR PRESSURE ENVIRONMENT |
| | CONDITION | MSB FORMATION | MSB FORMATION | MSB FORMATION |

TABLE 1-continued

| | | | | |
|---|---|---|---|---|
| SiC SEMICONDUCTOR SUBSTRATE 14 AFTER EPITAXIAL GROWTH PROCESS S20 NUMBER OF BPDS | PRESENCE OR ABSENCE OF MSB | PRESENCE OF MSB | PRESENCE OF MSB | PRESENCE OF MSB |
| | HEIGHT OF STEP 15 [nm] | >1.0 | >1.0 | >1.0 |
| | STEP END SHAPE | ZIGZAG SHAPE | ZIGZAG SHAPE | ZIGZAG SHAPE |
| | TERRACE WIDTH W2 [nm] | 55 | 40 | 45 |
| | NUMBER (PIECES) OF BPDS IN GROWTH LAYER 13 | 0 | 2 | 12 |
| | DENSITY (PIECES/cm$^2$) OF BPDS IN GROWTH LAYER 13 | 0 | 4 | 24 |
| | NUMBER (PIECES) OF BPDS IN BULK LAYER 12 | 1200 | 669 | 276 |
| | DENSITY (PIECES/cm$^2$) OF BPDS IN BULK LAYER 12 | 2400 | 1338 | 552 |
| TERRACE WIDTH CHANGE RATE [%] | | 292.86 | 53.85 | 542.86 |
| BPD CONVERSION RATE [%] | | 100.00 | 99.70 | 95.65 |
| SiC SUBSTRATE 10 BEFORE STRAINED LAYER REMOVAL PROCESS S10 | POLYTYPE | 4H—SiC | 4H—SiC | 4H—SiC |
| | OFF ANGLE (OFF DIRECTION) | 4° OFF (<11-20> DIRECTION) | 4° OFF (<11-20> DIRECTION) | 4° OFF (<11-20> DIRECTION) |
| | SUBSTRATE SIZE [mm] | 10 × 5 | 10 × 5 | 10 × 5 |
| | PRESENCE OR ABSENCE OF MSB | ABSENCE OF MSB | ABSENCE OF MSB | ABSENCE OF MSB |
| | SURFACE FINISHING | CMP | CMP | CMP |
| | HEIGHT OF STEP 15 [nm] | 0.25 to 1 | 0.25 to 1 | 0.25 to 1 |
| | WIDTH OF TERRACE 16 [nm] | 7 | 7 | 7 |
| | PRESENCE OR ABSENCE OF STRAINED LAYER 11 | PRESENCE OF STRAINED LAYER 11 | PRESENCE OF STRAINED LAYER 11 | PRESENCE OF STRAINED LAYER 11 |
| CONDITIONS OF Si VAPOR PRESSURE ETCHING METHOD (STRAINED LAYER REMOVAL PROCESS S10) | HEATING TEMPERATURE [° C.] | 1800 | 1800 | — |
| | ETCHING TIME [min] | 60 | 600 | — |
| | ETCHING AMOUNT [um] | 20 | 8 | — |
| | TANTALUM SILICIDE LAYER | Ta$_5$Si$_3$ | Ta$_5$Si$_3$ | — |
| | Ar GAS [Pa] | — | 10000 | — |
| SiC SUBSTRATE 10 BEFORE EPITAXIAL GROWTH PROCESS S20 | PRESENCE OR ABSENCE OF STRAINED LAYER 11 | ABSENCE OF STRAINED LAYER 11 | ABSENCE OF STRAINED LAYER 11 | PRESENCE OF STRAINED LAYER 11 |
| | PRESENCE OR ABSENCE OF MSB | ABSENCE OF MSB | PRESENCE OF MSB | ABSENCE OF MSB |
| | HEIGHT OF STEP 15 [nm] | 1.0 | >1.0 | 0.25 to 1 |
| | TERRACE WIDTH W1 [nm] | 14 | 26 | 7 |
| CONDITIONS OF SUBLIMATION METHOD (EPITAXIAL GROWTH PROCESS S20) | GROWTH TEMPERATURE [° C.] | 1800 | 1800 | 1800 |
| | GROWTH TIME [min] | 360 | 360 | 360 |
| | GROWTH AMOUNT [um] | 10 | 10 | 10 |
| | Si SUBSTRATE AMOUNT [g] | NONE | NONE | NONE |
| | GROWTH ENVIRONMENT | SiC—C EQUILIBRIUM VAPOR PRESSURE ENVIRONMENT | SiC—C EQUILIBRIUM VAPOR PRESSURE ENVIRONMENT | SiC—C EQUILIBRIUM VAPOR PRESSURE ENVIRONMENT |
| | CONDITION | MSB FORMATION | MSB FORMATION | MSB FORMATION |
| SiC SEMICONDUCTOR SUBSTRATE 14 AFTER EPITAXIAL GROWTH PROCESS S20 NUMBER OF BPDS | PRESENCE OR ABSENCE OF MSB | PRESENCE OF MSB | PRESENCE OFMSB | PRESENCE OF MSB |
| | HEIGHT OF STEP 15 [nm] | >1.0 | >1.0 | >1.0 |
| | STEP END SHAPE | ZIGZAG SHAPE | ZIGZAG SHAPE | ZIGZAG SHAPE |
| | TERRACE WIDTH W2 [nm] | 55 | 40 | 45 |
| | NUMBER (PIECES) OF BPDS IN GROWTH LAYER 13 | 0 | 2 | 12 |
| | DENSITY (PIECES/cm$^2$) OF BPDS IN GROWTH LAYER 13 | 0 | 4 | 24 |
| | NUMBER (PIECES) OF BPDS IN BULK LAYER 11 | 1200 | 669 | 276 |
| | DENSITY (PIECES/cm$^2$) OF BPDS IN BULK LAYER 11 | 2400 | 1338 | 552 |
| TERRACE WIDTH CHANGE RATE [%] | | 292.86 | 53.85 | 542.86 |
| BPD CONVERSION RATE [%] | | 100.00 | 99.70 | 95.65 |

| | | EXAMPLE 4 | COMPARATIVE EXAMPLE 1 |
|---|---|---|---|
| SiC SUBSTRATE 10 BEFORE STRAINED LAYER REMOVAL PROCESS S10 | POLYTYPE | 4H—SiC | 4H—SiC |
| | OFF ANGLE (OFF DIRECTION) | 4° OFF (<11-20> DIRECTION) | 4° OFF (<11-20> DIRECTION) |
| | SUBSTRATE SIZE [mm] | 10 × 5 | 10 × 5 |
| | PRESENCE OR ABSENCE OF MSB | ABSENCE OF MSB | ABSENCE OF MSB |
| | SURFACE FINISHING | CMP | CMP |
| | HEIGHT OF STEP 15 [nm] | 0.25 to 1 | 0.25 to 1 |
| | WIDTH OF TERRACE 16 [nm] | 7 | 7 |
| | PRESENCE OR ABSENCE OF STRAINED LAYER 11 | PRESENCE OF STRAINED LAYER 11 | PRESENCE OF STRAINED LAYER 11 |

TABLE 1-continued

| | | | |
|---|---|---|---|
| CONDITIONS OF Si VAPOR PRESSURE ETCHING METHOD (STRAINED LAYER REMOVAL PROCESS S10) | HEATING TEMPERATURE [° C.] | 1945 | 1800 |
| | ETCHING TIME [min] | 15 | 30 |
| | ETCHING AMOUNT [um] | 10 | 10 |
| | TANTALUM SILICIDE LAYER | TaSi$_2$ | Ta$_5$Si$_3$ |
| | Ar GAS [Pa] | — | — |
| SiC SUBSTRATE 10 BEFORE EPITAXIAL GROWTH PROCESS S20 | PRESENCE OR ABSENCE OF STRAINED LAYER 11 | ABSENCE OF STRAINED LAYER 11 | ABSENCE OF STRAINED LAYER 11 |
| | PRESENCE OR ABSENCE OF MSB | PRESENCE OF MSB | ABSENCE OF MSB |
| | HEIGHT OF STEP 15 [nm] | >1.0 | 1.0 |
| | TERRACE WIDTH W1 [nm] | 50 | 14 |
| CONDITIONS OF SUBLIMATION METHOD (EPITAXIAL GROWTH PROCESS S20) | GROWTH TEMPERATURE[° C.] | 1800 | 1800 |
| | GROWTH TIME [min] | 360 | 360 |
| | GROWTH AMOUNT [um] | 10 | 10 |
| | Si SUBSTRATE AMOUNT [g] | NONE | 0.45 |
| | GROWTH ENVIRONMENT | SiC—C EQUILIBRIUM VAPOR PRESSURE ENVIRONMENT | SiC—Si EQUILIBRIUM VAPOR PRESSURE ENVIRONMENT |
| | CONDITION | MSB FORMATION | MSB DECOMPOSITION |
| SiC SEMICONDUCTOR SUBSTRATE 14 AFTER EPITAXIAL GROWTH PROCESS S20 NUMBER OF BPDS | PRESENCE OR ABSENCE OF MSB | PRESENCE OF MSB | ABSENCE OF MSB |
| | HEIGHT OF STEP 15 [nm] | >1.0 | 1.0 |
| | STEP END SHAPE | ZIGZAG SHAPE | STRAIGHT SHAPE |
| | TERRACE WIDTH W2 [nm] | 48 | 14 |
| | NUMBER (PIECES) OF BPDS IN GROWTH LAYER 13 | 2 | 15 |
| | DENSITY (PIECES/cm$^2$) OF BPDS IN GROWTH LAYER 13 | 4 | 30 |
| | NUMBER (PIECES) OF BPDS IN BULK LAYER 12 | 62 | 222 |
| | DENSITY (PIECES/cm$^2$) OF BPDS IN BULK LAYER 12 | 124 | 444 |
| TERRACE WIDTH CHANGE RATE [%] | | −4.00 | 0.00 |
| BPD CONVERSION RATE [%] | | 96.77 | 93.24 |
| SiC SUBSTRATE 10 BEFORE STRAINED LAYER REMOVAL PROCESS S10 | POLYTYPE | 4H—SiC | 4H—SiC |
| | OFF ANGLE (OFF DIRECTION) | 4° OFF (<11-20> DIRECTION) | 4° OFF (<11-20> DIRECTION) |
| | SUBSTRATE SIZE [mm] | 10 × 5 | 10 × 5 |
| | PRESENCE OR ABSENCE OF MSB | ABSENCE OF MSB | ABSENCE OF MSB |
| | SURFACE FINISHING | CMP | CMP |
| | HEIGHT OF STEP 15 [nm] | 0.25 to 1 | 0.25 to 1 |
| | WIDTH OF TERRACE 16 [nm] | 7 | 7 |
| | PRESENCE OR ABSENCE OF STRAINED LAYER 11 | PRESENCE OF STRAINED LAYER 11 | PRESENCE OF STRAINED LAYER 11 |
| CONDITIONS OF Si VAPOR PRESSURE ETCHING METHOD (STRAINED LAYER REMOVAL PROCESS S10) | HEATING TEMPERATURE [° C.] | 1945 | 1800 |
| | ETCHING TIME [min] | 15 | 30 |
| | ETCHING AMOUNT [um] | 10 | 10 |
| | TANTALUM SILICIDE LAYER | TaSi$_2$ | Ta$_5$Si$_3$ |
| | Ar GAS [Pa] | — | — |
| SiC SUBSTRATE 10 BEFORE EPITAXIAL GROWTH PROCESS S20 | PRESENCE OR ABSENCE OF STRAINED LAYER 11 | ABSENCE OF STRAINED LAYER 11 | ABSENCE OF STRAINED LAYER 11 |
| | PRESENCE OR ABSENCE OF MSB | PRESENCE OF MSB | ABSENCE OF MSB |
| | HEIGHT OF STEP 15 [nm] | >1.0 | 1.0 |
| | TERRACE WIDTH W1 [nm] | 50 | 14 |
| CONDITIONS OF SUBLIMATION METHOD (EPITAXIAL GROWTH PROCESS S20) | GROWTH TEMPERATURE[° C.] | 1800 | 1800 |
| | GROWTH TIME [min] | 360 | 360 |
| | GROWTH AMOUNT [um] | 10 | 10 |
| | Si SUBSTRATE AMOUNT [g] | NONE | 0.45 |
| | GROWTH ENVIRONMENT | SiC—C EQUILIBRIUM VAPOR PRESSURE ENVIRONMENT | SiC—Si EQUILIBRIUM VAPOR PRESSURE ENVIRONMENT |
| | CONDITION | MSB FORMATION | MSB DECOMPOSITION |
| SiC SEMICONDUCTOR SUBSTRATE 14 AFTER EPITAXIAL GROWTH PROCESS S20 NUMBER OF BPDS | PRESENCE OR ABSENCE OF MSB | PRESENCE OF MSB | ABSENCE OF MSB |
| | HEIGHT OF STEP 15 [nm] | >1.0 | 1.0 |
| | STEP END SHAPE | ZIGZAG SHAPE | STRAIGHT SHAPE |
| | TERRACE WIDTH W2 [nm] | 48 | 14 |
| | NUMBER (PIECES) OF BPDS IN GROWTH LAYER 13 | 2 | 15 |
| | DENSITY (PIECES/cm$^2$) OF BPDS IN GROWTH LAYER 13 | 4 | 30 |
| | NUMBER (PIECES) OF BPDS IN BULK LAYER 11 | 62 | 222 |
| | DENSITY (PIECES/cm$^2$) OF BPDS IN BULK LAYER 11 | 124 | 444 |

TABLE 1-continued

| TERRACE WIDTH CHANGE RATE [%] | −4.00 | 0.00 |
| BPD CONVERSION RATE [%] | 96.77 | 93.24 |

In Example 1, the strained layer 11 was removed by using the Si vapor pressure etching method under the condition that MSB was not formed (strained layer removal process S10), and growth was conducted by using the sublimation method in the SiC—C equilibrium vapor pressure environment (epitaxial growth process S20). As a result, the BPD conversion rate of the growth layer 13 was 100%. At this time, the terrace width W1 before the epitaxial growth process S20 was 14 nm, and the terrace width W2 after the epitaxial growth process S20 was 55 nm (terrace width change rate=292.86%).

In Example 2, the strained layer 11 was removed by using the Si vapor pressure etching method under the condition that MSB was formed (strained layer removal process S10), and growth was conducted under the same conditions as in Example 1 (in the SiC—C equilibrium vapor pressure environment) (epitaxial growth process S20). As a result, the BPD conversion rate of the growth layer 13 was 99.7%. At this time, the terrace width W1 before the epitaxial growth process S20 was 26 nm, and the terrace width W2 after the epitaxial growth process S20 was 40 nm (terrace width change rate=53.85%).

Incidentally, from this result, it can be seen that in a case where MSB is formed on the surface of the SiC substrate 10 before epitaxial growth, the BPD conversion rate is lower than that in Example 1.

In Example 3, without performing the strained layer removal process S10 of removing the strained layer 11, growth was conducted under the same conditions as in Examples 1 and 2 (in the SiC—C equilibrium vapor pressure environment) (epitaxial growth process S20). As a result, the BPD conversion rate of the growth layer 13 was 95.65%. At this time, the terrace width W1 before the epitaxial growth process S20 was 7 nm, and the terrace width W2 after the epitaxial growth process S20 was 45 nm (terrace width change rate=542.86%).

From this result, it can be seen that the epitaxial growth process S20 of growing the SiC substrate 10 under the SiC—C equilibrium vapor pressure environment is included so that the BPD conversion rate in the growth layer 13 becomes 95% or more. Further, it can be seen that in a case where the strained layer 11 remains on the SiC substrate 10 before the epitaxial growth, the BPD conversion rate is lower than that in Example 1 and Example 2.

In Example 4, the strained layer 11 was removed under the condition that MSB was formed (strained layer removal process S10), and growth was conducted under the same conditions as in Example 1 and Example 2 (in the SiC—C equilibrium vapor pressure environment) (epitaxial growth process S20). As a result, the BPD conversion rate of the growth layer 13 was 96.77%. At this time, the terrace width W1 before the epitaxial growth process S20 was 50 nm, and the terrace width W2 after the epitaxial growth process S20 was 48 nm (terrace width change rate=−4.00%).

From this result, it can be seen that the epitaxial growth process S20 of growing the SiC substrate 10 under the SiC—C equilibrium vapor pressure environment is included so that the BPD conversion rate in the growth layer 13 becomes 95% or more. Further, it can be seen that in the epitaxial growth process S20, in a case where the SiC substrate is not grown under the condition that the terrace width increases, the BPD conversion rate is lower than that in Example 1 and Example 2.

According to Example 1, the SiC semiconductor substrate 14 can be manufactured in which in an area of 10 mm×5 mm, the number of BPDs on the surface of the bulk layer 12 is 1200, and the number of BPDs on the surface of the growth layer 13 is zero.

That is, according to Example 1, the SiC semiconductor substrate 14 can be manufactured in which the BPD density of the bulk layer 12 is 2400 pieces/cm$^2$, and the BPD density of the surface of the growth layer 13 is 0 piece/cm$^2$.

In other words, according to Example 1, the SiC semiconductor substrate 14 can be manufactured in which the BPD density of the bulk layer 12 is 2000 pieces/cm$^2$ or more, and the BPD density of the surface of the growth layer 13 is less than 1 piece/cm$^2$.

According to Example 2, the SiC semiconductor substrate 14 can be manufactured in which in an area of 10 mm×5 mm, the number of BPDs on the surface of the bulk layer 12 is 669, and the number of BPDs on the surface of the growth layer 13 is two.

That is, according to Example 2, the SiC semiconductor substrate 14 can be manufactured in which the BPD density of the bulk layer 12 is 1338 pieces/cm$^2$, and the BPD density of the surface of the growth layer 13 is 4 piece/cm$^2$.

In other words, according to Example 2, the SiC semiconductor substrate 14 can be manufactured in which the BPD density of the bulk layer 12 is 1000 pieces/cm$^2$ or more, and the BPD density of the surface of the growth layer 13 is less than 5 piece/cm$^2$.

According to Example 3, the SiC semiconductor substrate 14 can be manufactured in which in an area of 10 mm×5 mm, the number of BPDs on the surface of the bulk layer 12 is 276, and the number of BPDs on the surface of the growth layer 13 is 12.

That is, according to Example 3, the SiC semiconductor substrate 14 can be manufactured in which the BPD density of the bulk layer 12 is 552 pieces/cm$^2$, and the BPD density of the surface of the growth layer 13 is 24 piece/cm$^2$.

In other words, according to Example 3, the SiC semiconductor substrate 14 can be manufactured in which the BPD density of the bulk layer 12 is 500 pieces/cm$^2$ or more, and the BPD density of the surface of the growth layer 13 is 25 piece/cm$^2$ or less.

According to Example 4, the SiC semiconductor substrate 14 can be manufactured in which in an area of 10 mm×5 mm, the number of BPDs on the surface of the bulk layer 12 is 62, and the number of BPDs on the surface of the growth layer 13 is two.

That is, according to Example 4, the SiC semiconductor substrate 14 can be manufactured in which the BPD density of the bulk layer 12 is 552 pieces/cm$^2$, and the BPD density of the surface of the growth layer 13 is 4 piece/cm$^2$.

In other words, according to Example 4, the SiC semiconductor substrate 14 can be manufactured in which the BPD density of the bulk layer 12 is 100 pieces/cm$^2$ or more, and the BPD density of the surface of the growth layer 13 is 5 piece/cm$^2$ or less.

Incidentally, in the strained layer removal process S10 of Example 2, MSB is formed by introducing 10000 Pa of Ar gas while in the strained layer removal process S10 of Example 4, MSB is formed by adopting TaSi$_2$ as the tantalum silicide layer.

In Comparative Example 1, similarly to Example 1, the strained layer 11 was removed under the condition that MSB was not formed (strained layer removal process S10), and growth was conducted by using the sublimation method in the SiC—Si equilibrium vapor pressure environment (epitaxial growth process S20). Incidentally, the SiC—Si equilibrium vapor pressure environment is formed by arranging a Si substrate in the supplying space for source material S2. As a result, the BPD conversion rate of the growth layer 13 was 93.24%.

From this result, it can be seen that in a case where growth is conducted in the SiC—Si equilibrium vapor pressure environment, the BPD conversion rate is lower as compared with Examples 1 to 4.

Figure 11:
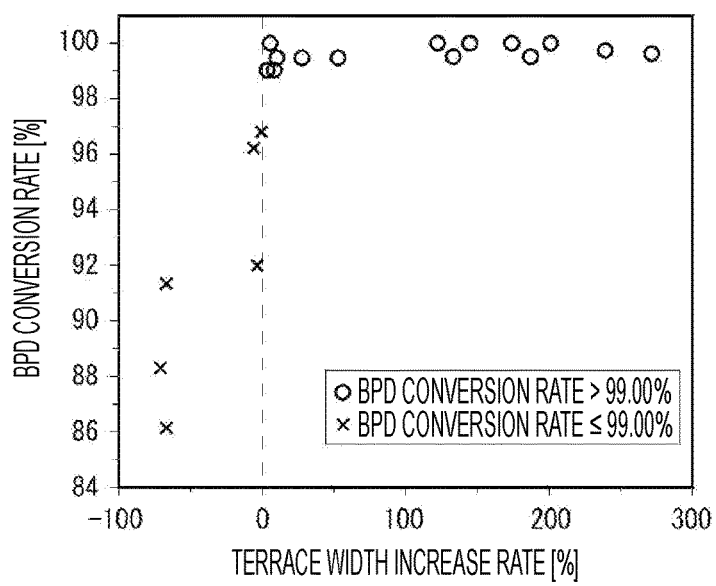
FIG. 11 is a graph illustrating a relationship between a BPD conversion rate and a terrace width increase rate in the manufacturing process of SiC semiconductor substrates according to one embodiment.

The present inventor or the like diligently examined and experimented to see whether there is a rule in the BPD conversion rate, and as illustrated in FIG. 11, It was found that the BPD conversion rate greatly related to a change rate (terrace width increase rate) in the terrace width W before and after epitaxial growth.

FIG. 11 is a graph in which the terrace width increase rate ((terrace width before growth W2–terrace width after growth W1)/terrace width after growth W1) is plotted on the horizontal axis, and the BPD conversion rate is plotted on the vertical axis. The plot illustrated in FIG. 11 illustrates a plurality of experiment results in which a plurality of SiC substrates 10 from which the strained layer 11 is removed and which have different terrace widths W1 are grown by 3 μm at any growth temperature of 1700° C., 1800° C., or 1900° C. under the SiC—Si equilibrium vapor pressure environment or the SiC—C equilibrium vapor pressure environment.

According to this results, in a case where the terrace width increase rate was larger than 0, that is, a case where the SiC substrate 10 from which the strained layer 11 was removed was grown under the condition that the terrace width W increases during epitaxial growth, the BPD conversion rate was 99.00% or more.

That is, according to the manufacturing method of SiC semiconductor substrates according to the present invention, the strained layer removal process S10 of removing the strained layer 11 of the SiC substrate 10 and the epitaxial growth process S20 of conducting growth under the condition that the terrace width of the SiC substrate 10 increases are included so that the BPD density in the growth layer 13 can be reduced. Further, the BPD conversion rate can be set to 100% by conducting epitaxial growth on the SiC substrate 10 on which the MSB is not formed in the C-rich environment.

Incidentally, in the epitaxial growth process S20, in a case where the SiC substrate 10 is grown in the SiC—C equilibrium vapor pressure environment, a step-terrace structure is formed in which the terrace width W2 is 40 to 200 nm, and the step height is 3 to 14 nm. Therefore, the terrace width W1 of the SiC substrate 10 before the epitaxial growth process S20 is preferably less than 40 nm, more preferably less than 30 nm, still more preferably less than 20 nm, still more preferably less than 15 nm, and still more preferably 14 nm.

REFERENCE SIGNS LIST

S10 Strained layer removal process
S20 Epitaxial growth process
S30 Bunching decomposition process
10 SiC substrate
11 Strained layer
12 Bulk layer
13 Growth layer
14 SiC semiconductor substrate
15 Step
16 Terrace
20 Carburizing container
30 Source material container
40 High-temperature vacuum furnace
41 Main heating chamber
42 Preheating chamber
43 Moving unit
S1 Si vapor pressure space
S2 Supplying space for source material
BPD Basal plane dislocation
MSB Macro step bunching
W Terrace width

The invention claimed is:

1. A manufacturing method of SiC semiconductor substrates, the method comprising:
a strained layer removal process that removes a strained layer of a SiC substrate; and
an epitaxial growth process that conducts growth under a condition that a terrace width of the SiC substrate increases, wherein
in the epitaxial growth process, epitaxial growth is conducted under a growth condition that macro step bunching having a zigzag-shaped step end is formed when growth is conducted on a SiC substrate of which an off direction is <11–20>.

2. The manufacturing method of SiC semiconductor substrates according to claim 1, wherein
in the epitaxial growth process, growth is conducted in a SiC—C equilibrium vapor pressure environment.

3. The manufacturing method of SiC semiconductor substrates according to claim 1, wherein
in the epitaxial growth process, a supplying source for Si atom and a supplying source for C atom are arranged for growth such that an atomic number ratio Si/C in a supplying space for source material is 1 or less.

4. The manufacturing method of SiC semiconductor substrates according to claim 1, wherein
in the epitaxial growth process, the SiC substrate is grown in a C-rich environment by using a CVD method.

5. The manufacturing method of SiC semiconductor substrates according to claim 1, wherein
in the epitaxial growth process, growth is conducted on a SiC substrate on which macro step bunching is not formed.

6. The manufacturing method of SiC semiconductor substrates according to claim 1, wherein
the epitaxial growth process is performed at a temperature of 1600° C. or higher.

7. A manufacturing method of SiC semiconductor substrates, the method comprising:
a strained layer removal process that removes a strained layer of a SiC substrate; and
an epitaxial growth process that conducts growth under a condition that a terrace width of the SiC substrate increases; and
a bunching decomposition process of decomposing the macro step bunching after the epitaxial growth process.

8. A SiC semiconductor substrate comprising:
a bulk layer having basal plane dislocations; and
a growth layer in which the basal plane dislocations are converted into other than basal plane dislocations, wherein
a conversion rate of the basal plane dislocations in the growth layer is more than 99.95%,
a surface of the bulk layer is arranged with steps having a height of one unit cell.

9. A manufacturing device of SiC semiconductor substrates, the device comprising:
a supplying space for source material for supplying Si atoms and C atoms to a SiC substrate for growth; and
a high-temperature vacuum furnace capable of heating the supplying space for source material, wherein
the supplying space for source material has a supplying source for Si atom and a supplying source for C atom, and
the supplying source for Si atom and the supplying source for C atom are arranged such that an atomic number ratio Si/C in the supplying space for source material is 1 or less,
the high-temperature vacuum furnace includes
a main heating chamber capable of heating the supplying space for source material,
a preheating chamber which is connected to the main heating chamber, and
a moving unit that moves the supplying space for source material, wherein
the moving unit is configured to be movable between the main heating chamber and the preheating chamber.

10. The manufacturing device of SiC semiconductor substrates according to claim 9, the device further comprising:
a Si vapor pressure space in which a Si vapor pressure environment is formed, wherein
the supplying space for source material is evacuated through the Si vapor pressure space.

11. The manufacturing device of SiC semiconductor substrates according to claim 10, the device further comprising:
a source material container which has the supplying space for source material; and
a carburizing container which has the Si vapor pressure space.

12. The manufacturing device of SiC semiconductor substrates according to claim 9, wherein
a temperature gradient is provided in the supplying space for source material such that a temperature decreases toward the SiC substrate.

13. A method for reducing basal plane dislocations of SiC semiconductor substrates, the method comprising:
an epitaxial growth process that conducts growth under a condition that a terrace width of a SiC substrate increases, wherein
in the epitaxial growth process, epitaxial growth is conducted on the SiC substrate having a terrace width of less than 40 nm.

14. A method for reducing basal plane dislocations of SiC semiconductor substrates, the method comprising:
an epitaxial growth process that epitaxially grows a SiC substrate in a SiC—C equilibrium vapor pressure environment, wherein
in the epitaxial growth process, epitaxial growth is conducted on the SiC substrate having a terrace width of less than 40 nm.

15. The method for reducing basal plane dislocations of SiC semiconductor substrates according to claim 13, wherein
in the epitaxial growth process, a supplying source for Si atom and a supplying source for C atom are arranged for growth such that an atomic number ratio Si/C in a supplying space for source material is 1 or less.

16. The method for reducing basal plane dislocations of SiC semiconductor substrates according to claim 13, wherein
in the epitaxial growth process, growth is conducted on a SiC substrate on which macro step bunching is not formed.

17. A manufacturing method of SiC semiconductor substrates, the method comprising:
an epitaxial growth process that grows a SiC substrate in a SiC—C equilibrium vapor pressure environment, wherein
in the epitaxial growth process, epitaxial growth is conducted on the SiC substrate having a terrace width of less than 40 nm.

18. The manufacturing method of SiC semiconductor substrates according to claim 17, wherein
in the epitaxial growth process, a supplying source for Si atom and a supplying source for C atom are arranged for growth such that an atomic number ratio Si/C in a supplying space for source material is 1 or less.

19. The manufacturing method of SiC semiconductor substrates according to claim 17, wherein
in the epitaxial growth process, growth is conducted on a SiC substrate on which macro step bunching is not formed.

20. A SiC semiconductor substrate comprising:
a bulk layer which has basal plane dislocations; and
a growth layer in which the basal plane dislocations are converted into other than the basal plane dislocations, wherein
a density of the basal plane dislocations of a surface of the bulk layer is 2000 pieces/cm$^2$ or more, and a density of the basal plane dislocations of a surface of the growth layer is 100 pieces/cm$^2$ or less.

21. A SiC semiconductor substrate comprising:
a bulk layer which has basal plane dislocations; and
a growth layer in which the basal plane dislocations are converted into other than the basal plane dislocations, wherein
a density of the basal plane dislocations of a surface of the bulk layer is 2000 pieces/cm$^2$ or more, and a density of the basal plane dislocations of a surface of the growth layer is less than 1 piece/cm$^2$.

22. A SiC semiconductor substrate comprising:
a bulk layer which has basal plane dislocations; and
a growth layer in which the basal plane dislocations are converted into other than the basal plane dislocations, wherein
a density of the basal plane dislocations of a surface of the bulk layer is 2000 pieces/cm$^2$ or more, and a density of the basal plane dislocations of a surface of the growth layer is 0 pieces/cm$^2$.

23. A SiC semiconductor substrate which is manufactured by the manufacturing method according to claim 1.

24. The method for reducing basal plane dislocations of SiC semiconductor substrates according to claim 14, wherein
in the epitaxial growth process, a supplying source for Si atom and a supplying source for C atom are arranged for growth such that an atomic number ratio Si/C in a supplying space for source material is 1 or less.

25. The method for reducing basal plane dislocations of SiC semiconductor substrates according to claim 14, wherein
   in the epitaxial growth process, growth is conducted on a SiC substrate on which macro step bunching is not formed.

26. A SiC semiconductor substrate which is manufactured by the manufacturing method according to claim 17.

27. The manufacturing method of SiC semiconductor substrates according to claim 1, wherein
   in the epitaxial growth process, growth is conducted on the SiC substrate that has been processed by the strained layer removal process and has the steps of one unit cell height on the surface.

28. The manufacturing method of SiC semiconductor substrates according to claim 17, wherein
   in the epitaxial growth process, the SiC substrate having steps of one unit cell height is grown epitaxially.

29. The method for reducing basal plane dislocations of SiC semiconductor substrates according to claim 13, wherein
   in the epitaxial growth process, the SiC substrate having steps of one unit cell height is grown epitaxially.

30. The method for reducing basal plane dislocations of SiC semiconductor substrates according to claim 14, wherein
   in the epitaxial growth process, the SiC substrate having steps of one unit cell height is grown epitaxially.

* * * * *